United States Patent
Kotani et al.

(10) Patent No.: US 9,166,031 B2
(45) Date of Patent: Oct. 20, 2015

(54) SEMICONDUCTOR DEVICE

(71) Applicant: FUJITSU LIMITED, Kawasaki-shi, Kanagawa (JP)

(72) Inventors: Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/323,461

(22) Filed: Jul. 3, 2014

(65) Prior Publication Data

US 2015/0060765 A1 Mar. 5, 2015

(30) Foreign Application Priority Data

Sep. 5, 2013 (JP) .................. 2013-184113

(51) Int. Cl.
*H01L 29/778* (2006.01)
*H01L 29/739* (2006.01)
(Continued)

(52) U.S. Cl.
CPC .......... *H01L 29/7783* (2013.01); *H01L 29/151* (2013.01); *H01L 29/2003* (2013.01); *H01L 29/205* (2013.01); *H01L 29/7786* (2013.01); *H01L 29/66431* (2013.01)

(58) Field of Classification Search
CPC . H01L 29/151; H01L 29/205; H01L 29/2003; H01L 29/66431; H01L 29/7786
USPC .......... 257/14, 15, 20, 22, 76, 190, 194, 637, 257/E29.089, E29.246, E33.025, E21.09; 438/46, 172, 197, 476, 478
See application file for complete search history.

(56) References Cited

U.S. PATENT DOCUMENTS 7,498,638 B2    3/2009  Suzuki
7,569,870 B2 *  8/2009  Yanagihara et al. .......... 257/192
(Continued)

FOREIGN PATENT DOCUMENTS

JP    2007-251144 A    9/2007
JP    2008-021847 A    1/2008
(Continued)

OTHER PUBLICATIONS

Office Action mailed on Mar. 12, 2015 issued with respect to the related U.S. Appl. No. 14/324,650.

*Primary Examiner* — Dao H Nguyen
(74) *Attorney, Agent, or Firm* — Kratz, Quintos & Hanson, LLP

(57) ABSTRACT

A semiconductor device includes a superlattice buffer layer formed on a substrate. A first semiconductor layer is formed by a nitride semiconductor on the superlattice buffer layer. A second semiconductor layer is formed by a nitride semiconductor on the first semiconductor layer. A gate electrode, a source electrode and a drain electrode are formed on the second semiconductor layer. The superlattice buffer layer is formed by alternately and periodically laminating a first superlattice formation layer and a second superlattice formation layer. The first superlattice formation layer is formed by $Al_xGa_{1-x}N$ and the second superlattice formation layer is formed by $Al_yGa_{1-y}N$, where a relationship x>y is satisfied. A concentration of an impurity element serving as an acceptor doped into a portion or a whole of the second superlattice formation layer is higher than a concentration of the impurity element serving as an acceptor doped into the first superlattice formation layer.

18 Claims, 28 Drawing Sheets

(51) Int. Cl.
*H01L 29/06* (2006.01)
*H01L 29/15* (2006.01)
*H01L 29/205* (2006.01)
*H01L 29/20* (2006.01)
*H01L 29/66* (2006.01)

(56) References Cited

U.S. PATENT DOCUMENTS

| | | |
|---|---|---|
| 7,652,282 B2 | 1/2010 | Yanagihara |
| 8,017,977 B2 | 9/2011 | Twynam |
| 8,212,288 B2 | 7/2012 | Komiyama |
| 8,264,001 B2 | 9/2012 | Sato |
| 8,847,203 B2 * | 9/2014 | Ikuta et al. .................. 257/15 |
| 8,957,454 B2 * | 2/2015 | Briere ........................... 257/194 |
| 2002/0100412 A1 | 8/2002 | Hirayama et al. |
| 2006/0191474 A1 | 8/2006 | Chen et al. |
| 2006/0192195 A1 * | 8/2006 | Lee ................................. 257/14 |
| 2007/0056506 A1 * | 3/2007 | Bridger et al. ................. 117/89 |
| 2008/0013230 A1 | 1/2008 | Suzuki |
| 2011/0298009 A1 | 12/2011 | Ikuta et al. |
| 2012/0273759 A1 | 11/2012 | Ikuta et al. |
| 2013/0075786 A1 * | 3/2013 | Ishiguro ........................ 257/194 |
| 2014/0091314 A1 * | 4/2014 | Ishiguro et al. ................. 257/76 |
| 2015/0060765 A1 | 3/2015 | Kotani et al. |

FOREIGN PATENT DOCUMENTS

| | | |
|---|---|---|
| JP | 2008-124373 A1 | 5/2008 |
| JP | 2008-171843 A | 7/2008 |
| JP | 2008-205117 A1 | 9/2008 |
| JP | 2008-218479 A1 | 9/2008 |
| JP | 2010-153817 A | 7/2010 |
| JP | 2010-225703 A1 | 10/2010 |
| JP | 2011-82494 A1 | 4/2011 |
| JP | 2012-9630 A1 | 1/2012 |
| JP | 2012-99539 A1 | 5/2012 |
| JP | 2012-151422 A1 | 8/2012 |

* cited by examiner $1\times10^{18}/cm^3$

IMPURITY (C, Fe)
CONCENTRATION $1 \times 10^{18}/cm^3$  $1 \times 10^{19}/cm^3$
IMPURITY (C, Fe)
CONCENTRATION

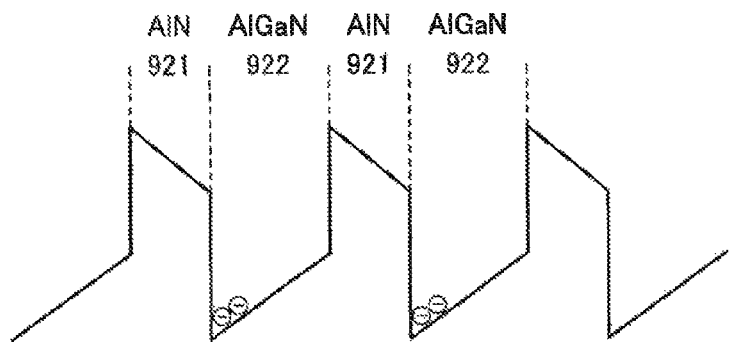
FIG.5A
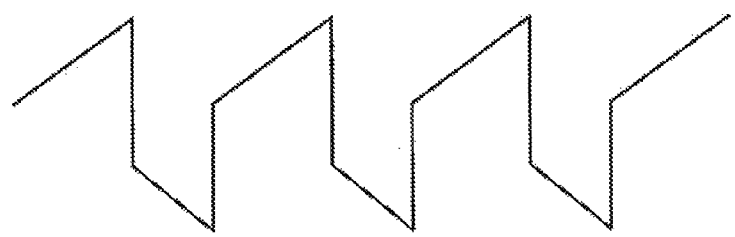
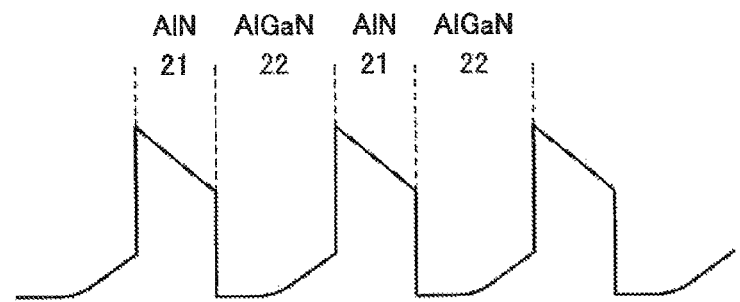
FIG.5B
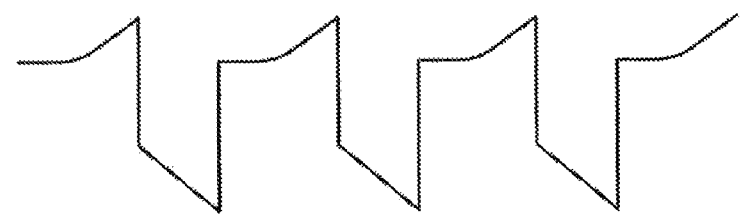

$1\times10^{16}/cm^3$  $1\times10^{18}/cm^3$
IMPURITY (C, Fe)
CONCENTRATION 120
121
122
123

1×10¹⁸/cm³  1×10¹⁹/cm³
IMPURITY (C, Fe)
CONCENTRATION

220

221
222a } 222
222b
223

$1 \times 10^{18}/cm^3$  $1 \times 10^{19}/cm^3$
Fe CONCENTRATION

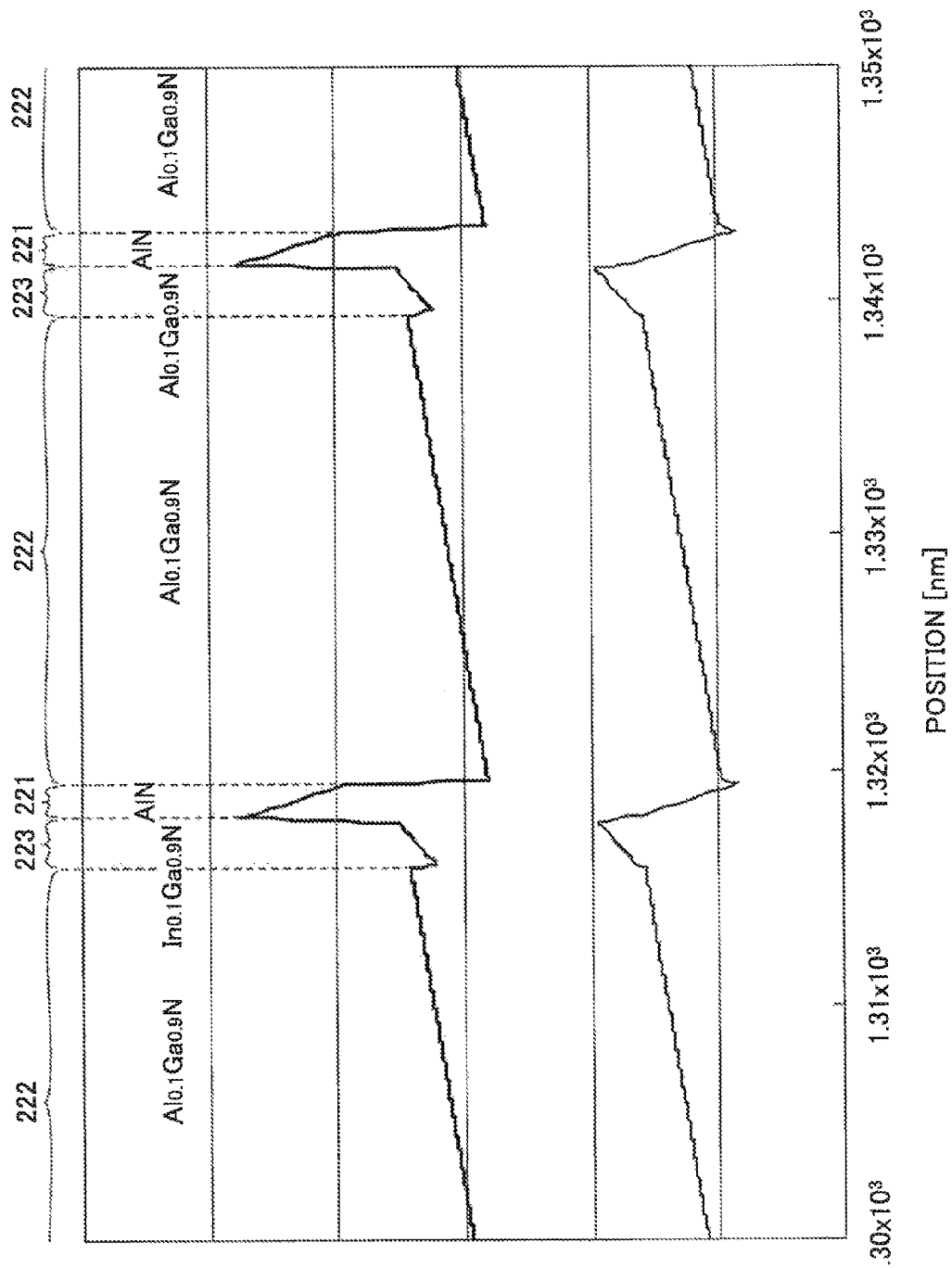

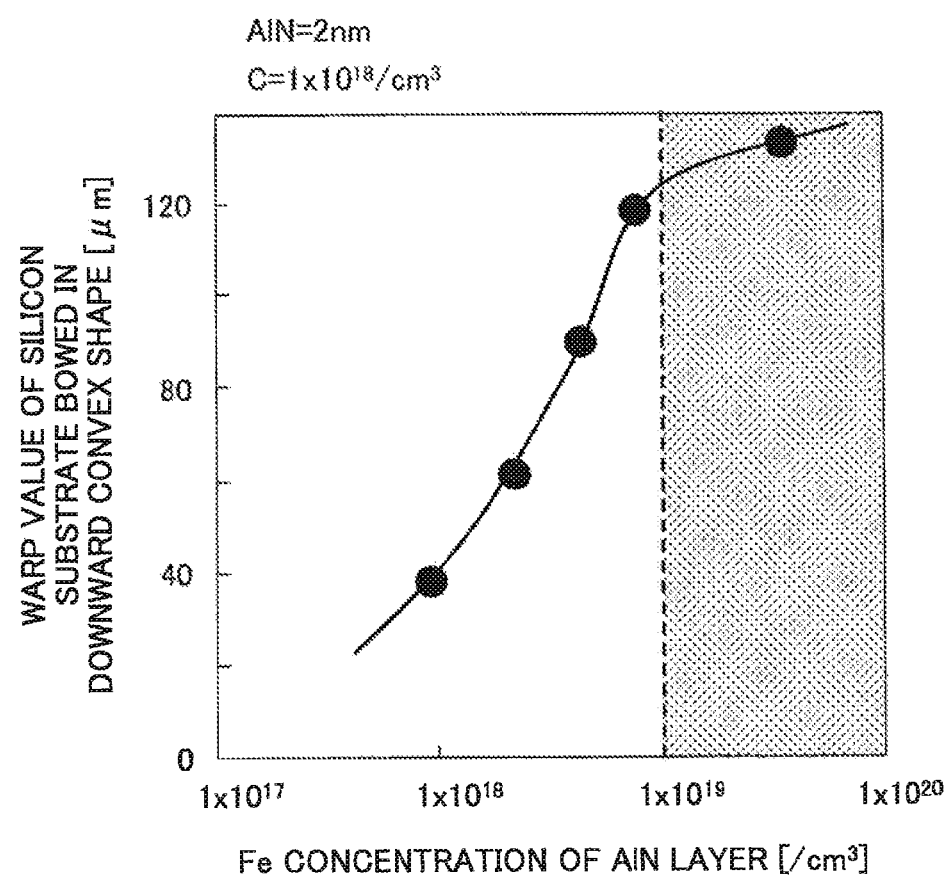

SEMICONDUCTOR DEVICE

CROSS-REFERENCE TO RELATED APPLICATIONS

This application is based upon and claims the benefit of priority of the prior Japanese Patent Application No. 2013-184113, filed on Sep. 5, 2013, the entire contents of which are incorporated herein by reference.

FIELD

The embodiments discussed herein are directed to a semiconductor device.

BACKGROUND

A nitride semiconductor has features such as a high saturation electron speed, a wide band gap, etc. Thus, it is considered to apply the nitride semiconductor to semiconductor devices having a high withstand voltage and a high output. For example, the bad gap of GaN, which is a nitride semiconductor, is 3.4 eV, which is higher than the band gap of Si (1.1 eV) and the band gap of GaAs (1.4 eV). Thus, GaN has a high breakdown electric field strength. Accordingly, the nitride semiconductor such as GaN or the like is extremely hopeful as a material to fabricate a power supply semiconductor device providing a high-voltage operation and a high-output.

As a semiconductor device using a nitride semiconductor, there are many reports with respect to a filed effect transistor, particularly, a high electron mobility transistor (HEMT). For example, from among GaN-HEMTs, an HEMT made of AlGaN/GaN attracts attention wherein GaN is used as an electron transit layer and AlGaN is used as an electron supply layer. In the HEMT made of AlGaN/GaN, a strain is generated in AlGaN due to a difference in lattice constant between GaN and AlGaN. Thereby, a highly concentrated two-dimensional electron gas (2DEG) can be obtained due to a piezoelectric polarization caused by such a strain and an intrinsic polarization difference. Thus, the AlGaN/GaN-HEMT is hopeful as a high-efficiency switch device and a high withstand voltage power device for electric vehicle. Additionally, from a view point of circuit design and safety, it is desired to materialize a nitride semiconductor transistor having a normally off characteristic.

The following patent documents disclose a background art.

Patent Document 1: Japanese Laid-Open Patent Application No. 2012-151422

Patent Document 2: Japanese Laid-Open Patent Application No. 2012-9630

Patent Document 3: Japanese Laid-Open Patent Application No. 2008-124373

In the meantime, in order to obtain a low cost and high quality nitride semiconductor transistor, it is necessary to cause a nitride semiconductor to be formed by high-quality epitaxial growth on a low cost silicon (Si) substrate having a large diameter. However, silicon and a nitride semiconductor such as GaN are different, from each other not only in their lattice constant but also in their coefficient of thermal expansion. Thus, in order to cause a high-quality GaN film to grow on a silicon substrate, an appropriately designed superlattice buffer layer is formed on the silicon substrate and a GaN film is formed on the superlattice buffer layer. The superlattice buffer layer can be formed by, for example, an AlN film and an AlGaN film, which are alternately laminated to form a lamination of a plurality of layers having a periodic structure. An electron transit layer and an electron supply layer are laminated on such a superlattice buffer layer.

In a nitride semiconductor transistor having the above-mentioned structure, a high-voltage is applied to a drain electrode while the transistor is in operation. If an insulation property of the superlattice buffer layer is low, there may be a case where a leak current flows in a vertical direction from the electron supply layer toward the silicon substrate via the superlattice buffer layer.

Thus, it is desirous to materialize a nitride semiconductor device formed on a silicon substrate, the semiconductor device having an insulating superlattice buffer layer and having a small leak current flowing in a vertical direction.

SUMMARY

There is provided according to an aspect of the embodiments, a semiconductor device including: a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by alternately and periodically laminating a first superlattice formation layer and a second superlattice formation layer, the first superlattice formation layer is formed by $Al_xGa_{1-x}N$ and the second superlattice formation layer is formed by $Al_yGa_{1-y}N$, where a relationship x>y is satisfied, and a concentration of an impurity element serving as an acceptor doped into a portion or a whole of the second superlattice formation layer is higher than a concentration of the impurity element serving as an acceptor doped into the first superlattice formation layer.

There is provided according to another aspect of the embodiments, a semiconductor device including: a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by periodically laminating a third superlattice formation layer, a second superlattice formation layer and a first superlattice formation layer in that order from the substrate, the first superlattice formation layer is formed by $Al_xGa_{1-x}N$, the second superlattice formation layer is formed by $Al_yGa_{1-y}N$, and the third superlattice formation layer is formed by $Al_zGa_{1-z}N$, where a relationship x>y>z is satisfied, and a concentration of an impurity element serving as an acceptor doped into the second superlattice formation, layer is higher than a concentration of the impurity element serving as an acceptor doped into the first superlattice formation layer and the third superlattice formation layer.

There is provided according to a further aspect of the embodiments a semiconductor device including; a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by periodically laminating a second superlattice formation layer, a first superlattice formation layer and a third superlattice formation layer in that order from the substrate, the first superlattice formation layer is formed by $Al_xGa_{1-x}N$ and the second superlattice formation layer is formed by $Al_yGa_{1-y}N$, where a relationship x>y is satisfied, the third superlattice formation layer is formed by a material containing InGaN, and a concentration of an impurity element serving as an acceptor doped into the second superlattice formation layer is higher than a concentration of the impurity element serving as an acceptor doped into the first superlattice formation layer and the third superlattice formation layer.

There is provided yet another aspect of the embodiments a semiconductor device including: a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by periodically laminating a layer containing a first superlattice formation layer and a second superlattice formation layer, the first superlattice formation layer is formed by $Al_xGa_{1-x}N$ and the second superlattice formation layer is formed by $Al_yGa_{1-y}N$, where a relationship x>y is satisfied, a film thickness of the first superlattice formation layer is greater than or equal to 0.8 nm and smaller than or equal to 2.0 nm, an impurity element C serving as an acceptor is doped into the first superlattice formation layer, and a concentration of C doped into the first superlattice formation layer is greater than or equal to $1\times10^{17}/cm^3$ and smaller than or equal to $1\times10^{20}/cm^3$.

There is provided yet another aspect of the embodiments a semiconductor device including: a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by periodically laminating a layer containing a first superlattice formation layer and a second superlattice formation layer, the first superlattice formation layer is formed by $Al_xGa_{1-x}N$ and the second superlattice formation layer is formed by $Al_yGa_{1-y}N$, where a relationship x>y is satisfied, a film thickness of the first superlattice formation layer is greater than or equal to 0.8 nm and smaller than or equal to 2.0 nm, an impurity element Fe serving as an acceptor is doped into the first superlattice formation layer, and a concentration of Fe doped into the first superlattice formation layer is smaller than or equal to $1\times10^{19}/cm^3$.

The object and advantages of the embodiments will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIG. 5A is a diagram illustrating an energy band in the superlattice buffer layer illustrated in FIG. 2A;

FIG. 5B is a diagram illustrating an energy band in the superlattice buffer layer illustrated in FIG. 4A;

FIG. 18 is a graph indicating an energy band in the superlattice buffer layer of the semiconductor device according to the third embodiment;

FIG. 25 is a graph indicating a relationship between an Fe concentration of an AlN layer and a warp value of a silicon substrate bowed in a downward convex shape;

DESCRIPTION OF EMBODIMENT(S)

Figure 1:
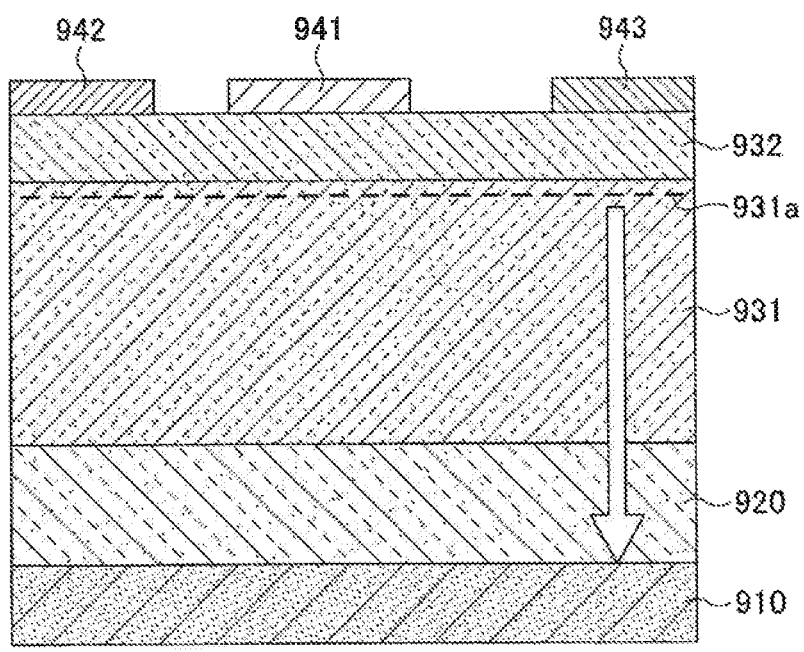
FIG. 1 is a cross-sectional view of a semiconductor device having a superlattice buffer layer.

A description will now be given of embodiments with reference to the drawings. In the drawings, the same parts are given the same reference number, and descriptions thereof will be omitted.

First Embodiment

First, a description will be given, with reference to FIG. 1 of a leak current flowing in a vertical direction in a semiconductor device in which a superlattice buffer layer is formed on a silicon substrate and a nitride semiconductor layer is formed on the superlattice buffer layer. FIG. 2A is an enlarged cross-sectional view of a portion of a superlattice buffer layer 920 formed in the semiconductor device illustrated in FIG. 1.

Figure 2A:
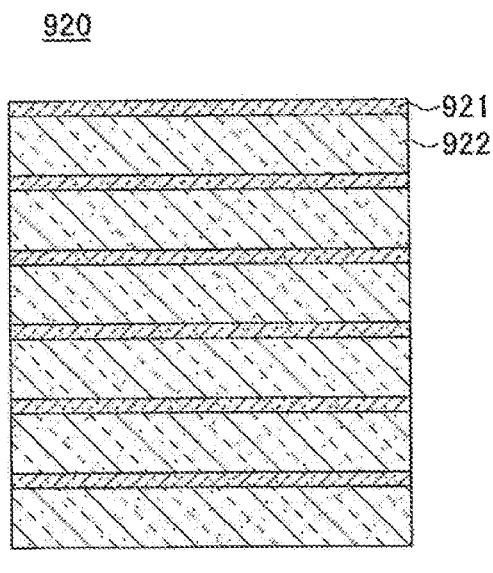
FIG. 2A is a cross-sectional view of the superlattice layer.

The semiconductor device illustrated in FIG. 1 has a structure in which a nitride semiconductor layer is laminated on a silicon substrate 910. Specifically, the superlattice buffer layer 920 is formed on the silicon substrate 910, and an electron transit layer 931 and an electron supply layer 932 are laminated on the superlattice buffer layer 920. A gate electrode 941, a source electrode 942 and a drain electrode 943 are formed on the electron supply layer 932. The electron transit layer 931 is formed by i-GaN, and the electron supply layer 932 is formed by AlGaN. Thereby, a two-dimensional electron gas (2DEG) 931*a* is created in the electron transit layer 931 near the interface between the electron transit layer 931 and the electron supply layer 932.

As illustrated in FIG. 2A, the superlattice buffer layer 920 is formed by laminating an AlN layer 921 and an AlGaN layer 922 alternately in a periodic manner. A superlattice buffer layer may be generally referred to as a strained-layer superlattice (SLS) layer. The AlGaN layer 922 is formed by $Al_{0.2}Ga_{0.8}N$. The electron transit layer 931 is formed by GaN. The electron supply layer 932 is formed by AlGaN. When a silicon substrate doped with an impurity element is used or when a nitride semiconductor layer is caused to grow, an impurity element such as Ga or the like enters into the silicon substrate 910. Thus, the silicon substrate 910 has a low electric resistance.

In the semiconductor device having the above-mentioned structure, if the electric resistance in the superlattice buffer layer 920 is low, a leak current may flow in the semiconductor device in a vertical direction (a direction perpendicular to the silicon substrate 910) as indicated by an arrow in FIG. 1. In order to reduce the leak current flowing in the vertical direction to the silicon substrate 910, there is a method of doping an impurity element serving as an acceptor, such as C, Fe, etc., into the superlattice buffer layer 920. Generally, the impurity element serving as an acceptor, such as C, Fe, etc., is doped so that the concentration of the impurity element is uniform in the superlattice buffer layer 920. For example, the impurity element is doped so that the impurity concentration is $1\times10^{18}/cm^3$.

An impurity element such as C, Fe, etc., which turns into acceptors, can give a higher insulating property as the concentration of the impurity element in the superlattice buffer layer 920 is increased. Thus, the leak current flowing in the semiconductor device, which is fabricated by forming a nitride semiconductor layer on the silicon substrate 910, can be reduced by increasing the impurity concentration in the superlattice buffer layer 920.

However, when the concentration of an impurity element such as C, Fe, etc., in the superlattice buffer layer 920 becomes high, a crack may be generated in the nitride semiconductor layer. Additionally, a warp of the silicon substrate 910 becomes large due to an influence of a stress in the film. If a warp in the silicon substrate 910 becomes large, there may be a case in which a desired pattern exposure cannot be achieved in an exposure process. Additionally, if a warp in the silicon substrate 910 becomes large, it becomes difficult to hold the silicon substrate 910 by suction to convey the silicon substrate 910 in the manufacturing process of semiconductor devices, which may result in a problem in manufacturing semiconductor devices.

Accordingly, it is desirous to develop a semiconductor device having a superlattice buffer layer having a high insulation property and a structure that suppresses a warp of the silicon substrate 910.

Semiconductor Device

Figure 3:
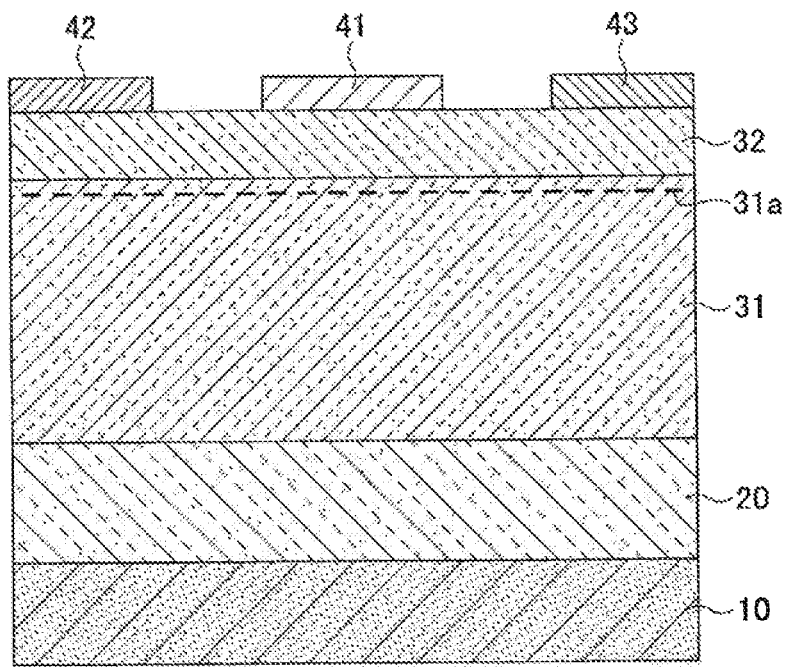
FIG. 3 is a cross-sectional view of a semiconductor device according to a first embodiment.

A description will be given below of a semiconductor device according to a first embodiment. As illustrated in FIG. 3, the semiconductor device according to the present embodiment, has a structure in which a nitride semiconductor layer is laminated on a silicon substrate 10. Specifically, a superlattice buffer layer 20 is formed on the silicon substrate 10, and an electron transit layer 31 and an electron supply layer 32 are formed on the superlattice buffer layer 20. The superlattice buffer layer 20 may be formed on a nuclear formation layer and a buffer layer formed on the silicon substrate 10.

A gate electrode, a source electrode and a drain electrode 43 are formed on the electron supply layer 32. In the present embodiment, the electron transit layer 32, which serves as a first semiconductor layer, is formed by AlGaN. Thereby, a 2DEG 31*a* is created in the electron transit layer 31 near an interface between the electron transit layer 31 and the electron supply layer 32. The electron supply layer, which serves as a second semiconductor layer, may be formed by InAlGaN.

Figure 4A:
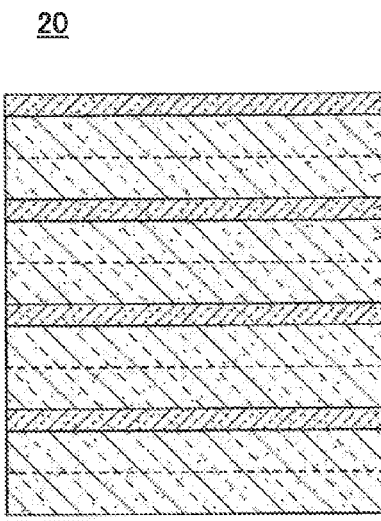
FIG. 4A is a cross-sectional view of a superlattice layer of the semiconductor device according to the first embodiment.

As illustrated in FIG. 4A, the superlattice buffer layer 20 is formed by alternately laminating an AlN layer 21, which serves as a first superlattice formation layer, and an AlGaN layer 22, which serves as a second superlattice formation layer. An impurity element such as C, Fe, etc., is doped into the superlattice buffer layer 20. In the present embodiment, the AlGaN layer 22 includes an upper layer 22*a* on the side where the electron transit layer 31 is formed and a lower layer 22*b* on the side of the silicon substrate 10. A concentration of the impurity element, which turns into an acceptor, of the upper layer 22*a* is higher than that of the lower layer 22*b*. In the present embodiment, the AlGaN layer 22 is formed by $Al_{0.2}Ga_{0.8}N$. The concentration of the impurity element in the AlN layer 21 is substantially equal to the concentration of the impurity element in the lower layer 22*b* of the AlGaN layer 22.

Figure 4B:
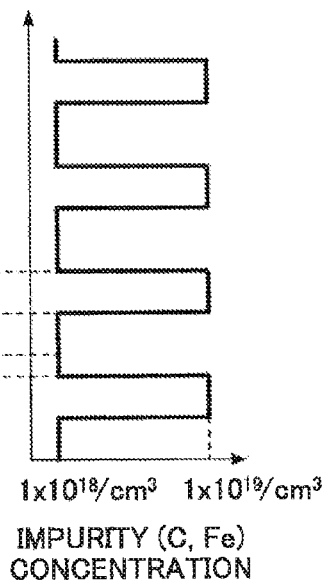
FIG. 4B is a graph indicating an impurity element concentration in the superlattice layer illustrated in FIG. 4A.
Figure 6A:
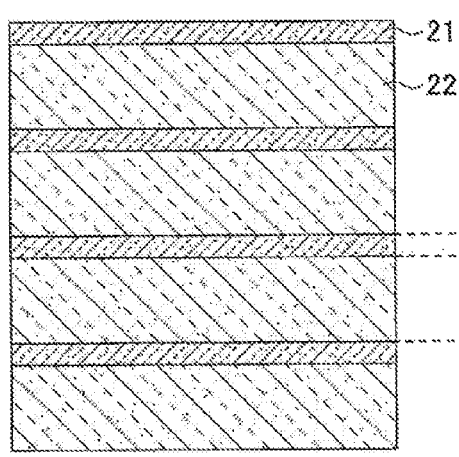
FIG. 6A is a cross-sectional view of another superlattice layer of the semiconductor device according to the first embodiment.
Figure 6B:
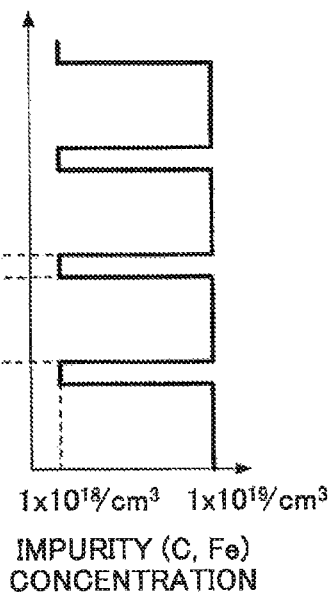
FIG. 6B is a graph indicating an impurity element concentration in the superlattice layer illustrated in FIG. 6A.

That is, in the present embodiment, the concentration of the impurity element in the upper layer 22*a* of the AlGaN layer 22 is higher than the concentration of the impurity element in the AlN layer 21 and the lower layer 22*b* of the AlGaN layer 22. Specifically, as illustrated in FIG. 4B, the concentration of the impurity element in the upper layer 22*a* of the AlGaN layer 22 is about $1\times10^{19}/cm^3$, and the concentration of impurity element in the AlN layer 21 and the lower layer 22*b* of the AlGaN layer 22 is about $1\times10^{18}/cm^3$.

In the present embodiment, the first superlattice formation layer, which serves as the AlN layer 21, is formed by $Al_xGa_{1-x}N$, in which x may be greater than or equal to 0.5 and smaller than or equal to 1. The second superlattice formation layer, which serves as the AlGaN layer 22, is formed by $Al_yGa_{1-y}N$, in which y may be greater than 0 and smaller than 0.5. Accordingly, the superlattice buffer layer 20 is formed so that a relationship x>y is satisfied. It should be noted that as an impurity element, which is doped into the superlattice buffer layer 20 and serve as an acceptor, there are Mg, Zn, Be, Cd, Li, etc., other than C and Fe.

In the semiconductor device according to the present embodiment, the concentration of the impurity element in the upper layer 22a of the AlGaN layer 22 is higher than other areas, and, thereby, carriers such as electrons are prevented from being pooled between the AlN layer 21 and the upper layer 22a of the AlGaN layer 22. This will be explained with reference to energy band diagrams illustrated in FIGS. 5A and 5B.

Figure 2B:
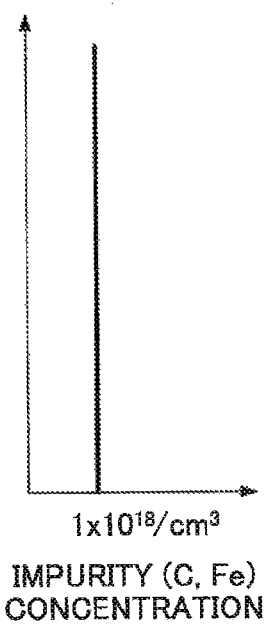
FIG. 2B is a graph indicating an impurity element concentration in the superlattice layer illustrated in FIG. 2A.

FIG. 5A is an energy band diagram of the superlattice buffer layer 920 having the structure illustrated in FIGS. 2A and 2B. FIG. 5B is an energy band diagram of the superlattice buffer layer 20 of the semiconductor device having the structure illustrated in FIGS. 4A and 4B. As illustrated in FIGS. 5A and 5B, by increasing the concentration of the impurity element in the upper layer 22a of the AlGaN layer 22 to be higher than other areas, the energy band in the area corresponding to the upper layer 22a can be raised upward. Thereby, carriers such as electrons are prevented from being pooled in the interface between the AlN layer 21 and the AlGaN layer 22 in the present embodiment, while carriers such as electrons are pooled, as illustrated in FIG. 5A, in the interface between the AlN layer 921 and the AlGaN layer 922 in the superlattice buffer layer 920 having the structure illustrated in FIGS. 2A and 2B.

Accordingly, the superlattice buffer layer 20 of the semiconductor device according to the present embodiment has a higher insulation property than the superlattice buffer layer 920 having the structure illustrated in FIGS. 2A and 2B. Thus, the superlattice buffer layer 20 has a higher electric resistance, thereby suppressing a leak current flowing in a vertical direction with respect to the silicon substrate.

Additionally, in the superlattice buffer layer 20 having the structure illustrated in FIGS. 4A and 4B, doping of the impurity element serving as an acceptor is limited to a minimum necessary area. Thus, a large warp or bow is not generated in the silicon substrate 10. That is, a warp generated in the silicon substrate 10 is larger when impurity elements are doped into the AlN layer 21 than when impurity elements are doped into the AlGaN layer 22. Thus, the warp of the silicon substrate 10 is prevented from being large by increasing the concentration of the impurity element serving as an acceptor only in the AlGaN layer 22.

Accordingly, in the present embodiment, the concentration of the impurity element serving as an acceptor may be caused to be high in the entire AlGaN layer 22, which gives small influence of warp to the silicon substrate 10. However, it is more preferable to suppress generation of a warp in the silicon substrate 10 by increasing the concentration of impurity element doped into only the upper layer 22a, which is a portion of the AlGaN layer 22.

Figure 7:
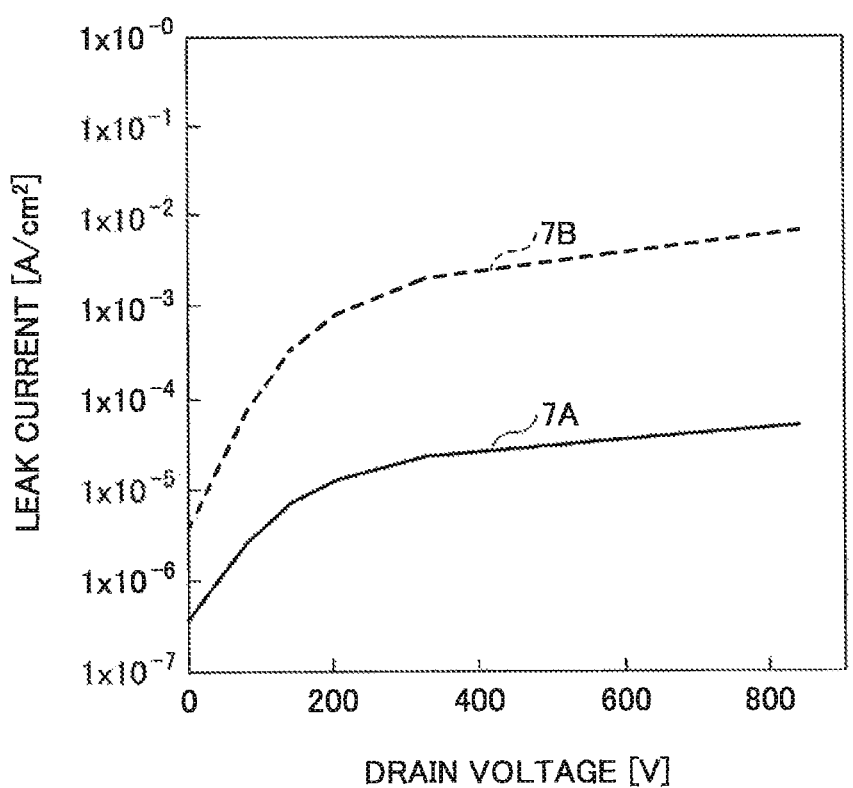
FIG. 7 is a graph indicating a relationship between a drain voltage and a leak current in a semiconductor device.

A description will be given below, with reference to FIG. 7 of a leak current flowing in a semiconductor device. In FIG. 7, a solid line 7A indicates a relationship between a drain voltage and a leak current in the semiconductor device having the structure illustrated in FIGS. 4A and 4B according to the present embodiment. A dashed line 7B indicates a relationship between a drain voltage and a leak current in the semiconductor device having the structure illustrated in FIGS. 2A and 2B.

As indicated by the line 7A, the leak current flowing in the semiconductor device according to the present embodiment is about $1\times10^{-5}/cm^2$ when the applied drain voltage is 200 V, and is $1\times10^{-5}/cm^2$ to $1\times10^{-4}/cm^2$ when the applied drain voltage is 800 V. On the other hand, as indicated by the line 7B, the leak current flowing in the semiconductor device having the structure as illustrated in FIGS. 2A and 2B is about $1\times10^{-3}/cm^2$ when the applied drain voltage is 200 V, and is $1\times10^{-3}/cm^2$ to $1\times10^{-2}/cm^2$ when the applied drain voltage is 800 V. Thus, the leak current flowing in a vertical direction in the semiconductor device according to the present embodiment is smaller than the leak current flowing in a vertical direction in the semiconductor device illustrated in FIGS. 2A and 2B by about two digits.

Figure 8:
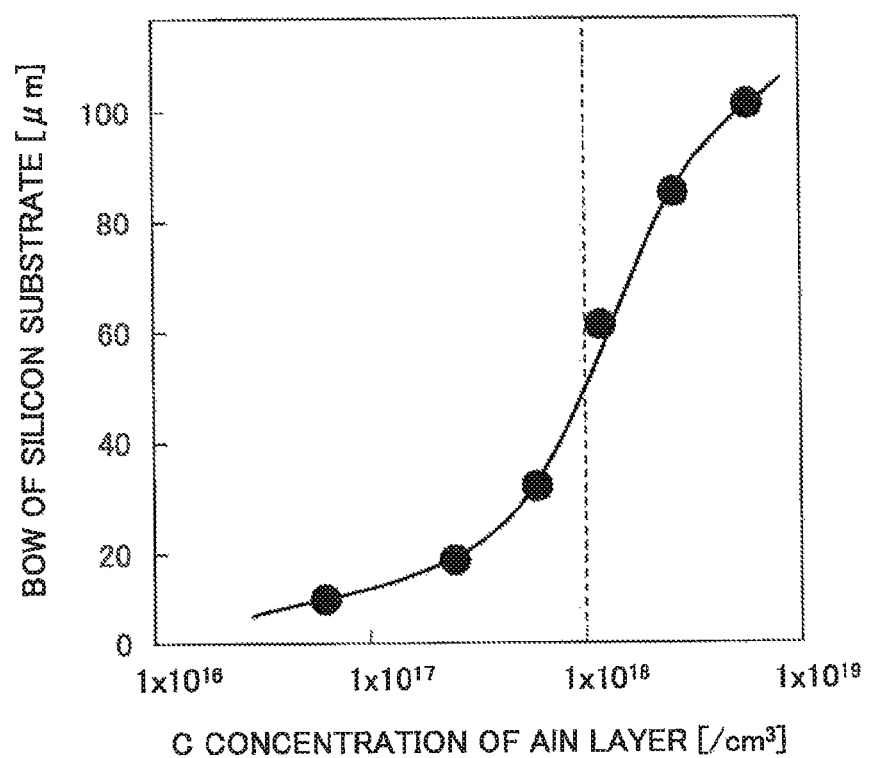
FIG. 8 is a graph indicating a relationship between a carbon (C) concentration of an AlN layer and bowing of a silicon substrate.

A description will be given, with reference to FIG. 8, of a concentration of C, which is an impurity element serving as an acceptor doped into the AlN layer and a warp of the silicon substrate. As illustrated in FIG. 8, if the concentration of C doped into the AlN layer is increased, a warp of the silicon substrate tends to become large. Here, the warp of the silicon substrate is preferably smaller than or equal to 60 μm. Thus, the concentration of C doped into the AlN layer is preferably smaller than or equal to $1\times10^{18}/cm^3$.

Figure 9:
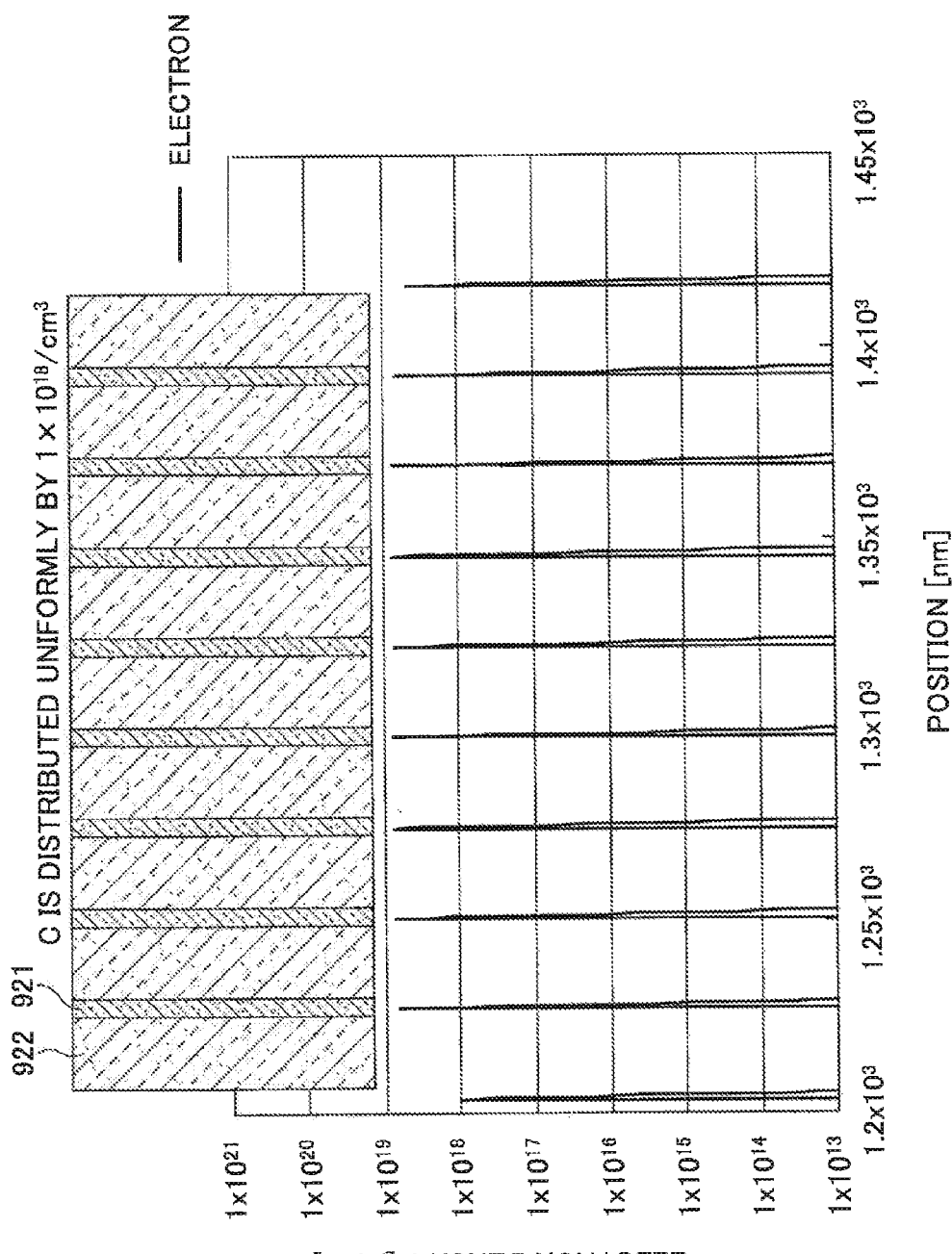
FIG. 9 is a graph indicating an electron density distribution in the superlattice buffer-layer illustrated in FIG. 2A.

A description will be given, with reference to FIG. 9, of a result of simulation by one dimensional calculation with respect to a carrier concentration in a superlattice buffer layer. FIG. 9 illustrates a result of simulation by one-dimensional calculation with respect to the superlattice buffer layer 920 having the structure illustrated in FIG. 2A. C as an impurity element is doped into the superlattice buffer layer 920 uniformly at a concentration of $1\times10^{18}/cm^3$. Although holes and electrons are pooled in the interface between the AlN layer 921 and the AlGaN layer 922, electrons are focused in FIG. 9.

Figure 10:
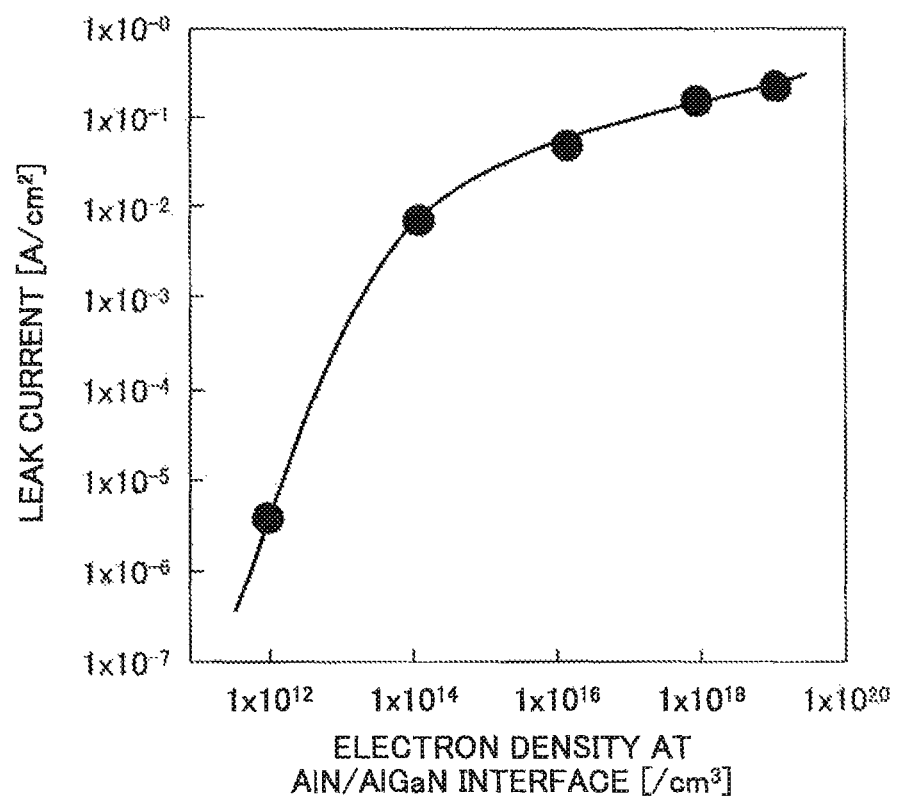
FIG. 10 is a graph indicating a relationship between an electron density and a leak current in the superlattice buffer layer.

As illustrated in FIG. 9, the electron density at the interface between the AlN layer 921 and the AlGaN layer 922 is about $1\times10^{19}/cm^3$. FIG. 10 illustrates a relationship between the electron density at the interface between the AlGaN layer and the AlN layer and a leak current. If the electron density is increased, the leak current is increased, and, thereby, a withstand voltage is decreased. When the electron density is about $1\times10^{19}/cm^3$, the leak current is as high as $1\times10^{-1}/cm^2$, and the withstand voltage is also low.

Figure 11:
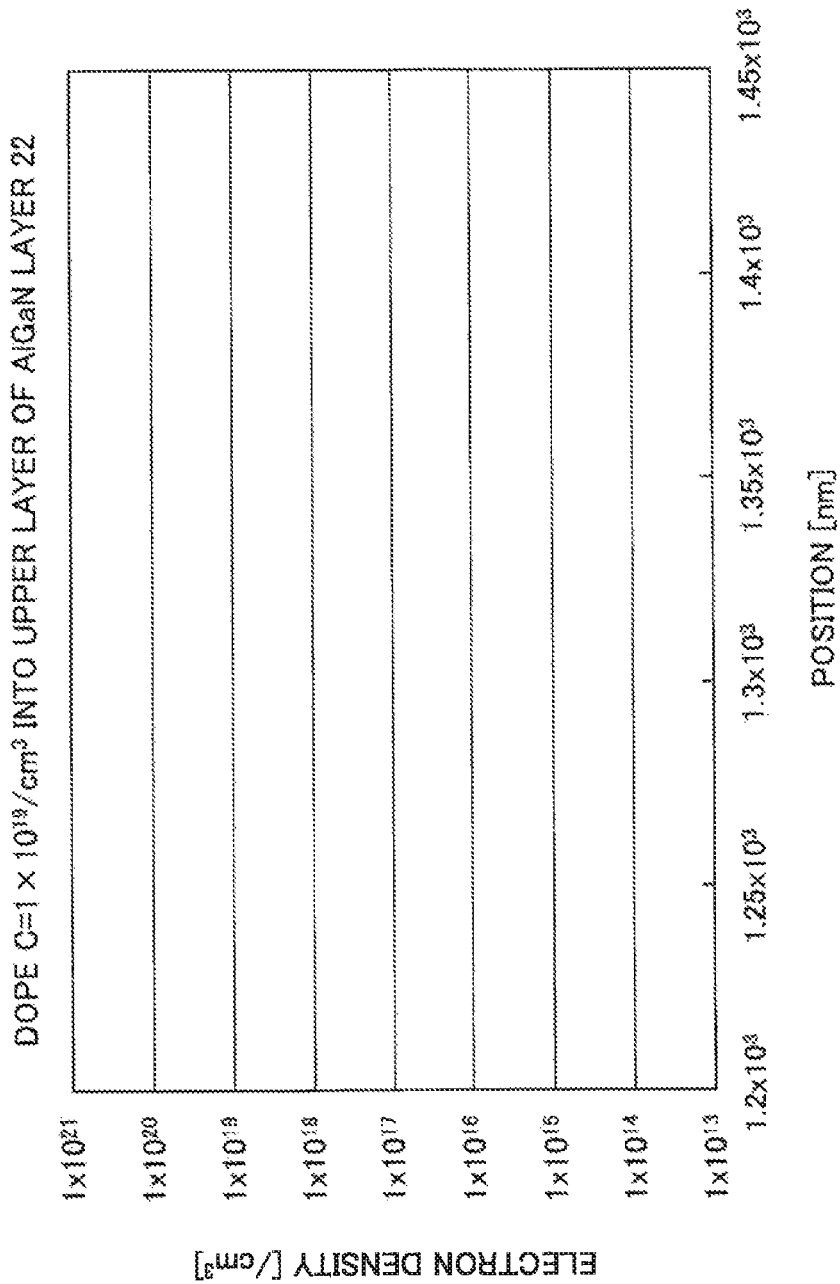
FIG. 11 is a graph indicating an electron density distribution in the superlattice buffer layer illustrated in FIG. 5A.

A description will be given, with reference to FIG. 11, of a result of simulation by one-dimensional calculation with respect to the carrier concentration in the superlattice buffer layer 20 of the semiconductor device according to the present embodiment. FIG. 11 illustrates a result of simulation by one-dimensional calculation in the superlattice buffer layer 20 having the structure illustrated in FIG. 4A. An impurity element is doped into the superlattice buffer layer 20 so that the concentration of the impurity element in the upper layer 22a of the AlGaN layer 22 is $1\times10^{19}/cm^3$ and the concentration of the impurity element in the lower layer 22b of the AlGaN layer 22 is $1\times10^{18}/cm^3$. As illustrated in FIG. 11, the electron density is smaller than or equal to $1\times10^{13}/cm^3$ at the interface between the AlN layer 21 and the AlGaN layer 22, which indicates that electrons are almost vanished. Accordingly, the leak current becomes small, which results in a high withstand voltage.

Figure 12:
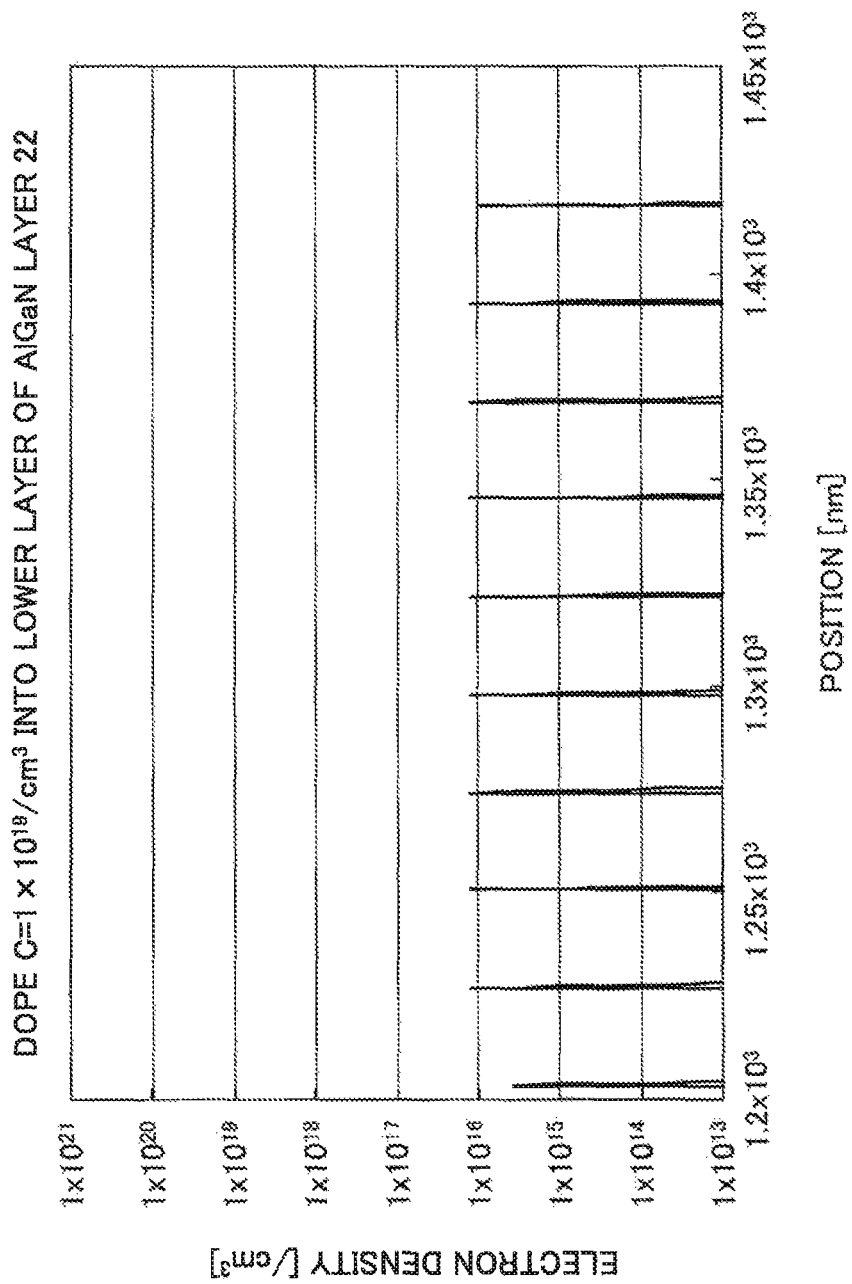
FIG. 12 is a graph indicating an electron density distribution in another superlattice buffer layer.

FIG. 12 illustrates a result of doping performed so that the concentration of the impurity element in the lower layer of the AlGaN layer 22 is $1\times10^{19}/cm^3$ and the concentration of the impurity element in the AlN layer 21 and the upper layer of the AlGaN layer 22 is $1\times10^{18}/cm^3$. As illustrated in FIG. 12, the peak of electron density at the interface between the AlN layer 21 and the AlGaN layer 22 is about $1\times10^{16}/cm^3$, and, thereby, the leak current can be reduced to be lower than that of the case where the superlattice buffer layer has the structure illustrated in FIGS. 2A and 2B. However, considering FIG. 11 and FIG. 12, the carrier concentration can be further reduced by increasing the concentration of C in the upper layer of the AlGaN layer to be higher than the concentration of C in the lower layer of the AlGaN layer. In such a case, the leak current can be reduced, and a withstand voltage is preferably improved.

Manufacturing Method of Semiconductor Device

A description will now be given, with reference to FIGS. 13A through 13D, of a manufacturing method of the semiconductor device according to the present embodiment. According to the manufacturing method of the semiconductor device of the present embodiment, the nitride semiconductor layer is formed on the silicon substrate 10 by epitaxial growth. As a method of forming a nitride semiconductor by epitaxial growth, there is a metal organic chemical vapor deposition (MOCVD) and a molecular beam epitaxy (MBE).

In the explanation of the present embodiment, it is assumed that the nitride semiconductor layer is formed by MOCVD. When forming the nitride semiconductor layer, trimethyl aluminum (TMA) is used as an Al source gas, trimethyl gallium (TMG) is used as a Ga source gas, and ammonium ($NH_3$) is used as an N source gas.

Figure 13A:
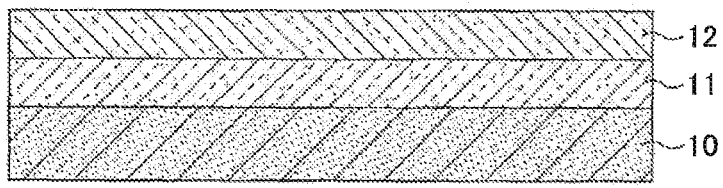
FIG. 13A through 13D are cross-sectional views for explaining a manufacturing method of the semiconductor device according to the first embodiment.

First, as illustrated in FIG. 13A, a nuclear formation layer 11 and a buffer layer 12 are formed by a nitride semiconductor sequentially on the silicon substrate 10. Although a silicon (111) substrate is used as the silicon substrate 10 in the present embodiment, a substrate formed of SiC, sapphire, GaN, etc., may be used instead of the silicon substrate 10. The nuclear formation layer 11 is formed of an AlN film having a thickness of 200 nm. The buffer layer 12 is formed of $Al_{0.4}Ga_{0.6}N$.

The nuclear formation layer 11 is formed by causing growth in a condition in which a substrate temperature is about 1000° C., a V/III ratio is 1000 to 2000, and a pressure in a chamber of an MOCVD apparatus is about 50 mbar (5 kPa). The buffer layer 12 is formed by causing a growth in a condition in which a substrate temperature is about 1000° C., a V/III ratio is 100 to 300, and a pressure in a chamber of an MOCVD apparatus is about 50 mbar (5 kPa). In the present embodiment, it is preferable to cause a growth by a condition by which an amount of C taken into the film is small. As for the buffer layer 12, in order to achieve flatness, it is preferable to cause a growth in a condition in which the V/III ratio is decreased.

Figure 13B:
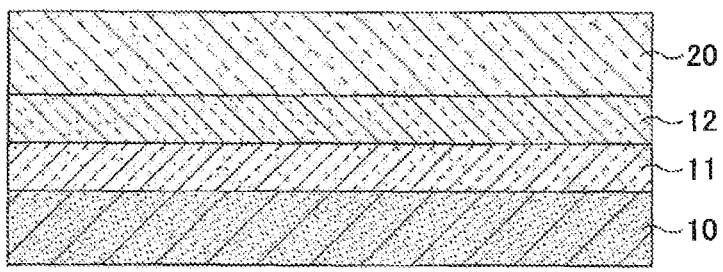

Then, as illustrated in FIG. 13B, the superlattice layer 20 is formed on the buffer layer 12. Specifically, as illustrated in FIG. 4A, the superlattice buffer layer 20 is formed by alternately and periodically laminating the AlN layer 21 and the AlGaN layer 22. The thus-formed AlN layer 21 has a film thickness of about 1.5 nm. The AlGaN layer 22 has a film thickness of about 20 nm. It is preferable to make a thickness of the AlN layer 21 to be smaller than or equal to 2 nm in order to avoid a decrease in the withstand voltage due to generation of remaining electrons. The AlGaN layer 22 is formed by $Al_{0.2}Ga_{0.8}N$. A temperature of the substrate when forming the superlattice buffer layer 20 is about 1020° C. The superlattice buffer layer 20 is formed by causing a growth in a condition in which a pressure in the chamber of the MOCVD apparatus is about 50 mbar (5 kPa).

According to the present embodiment, AlGaN layer 22 is formed while changing the growth condition so that the concentration of impurity element serving as an acceptor in the upper layer 22a is higher than that in the lower layer 22b. Specifically, C is used as an impurity element serving as an acceptor, and a mixing amount of C is adjusted by changing a V/III ratio. For example, when forming the lower layer 22b of the AlGaN layer 22, a growth is caused under a condition of the V/III ratio being set to about 1000. When forming the AlN layer 21, a growth is caused under a condition of the V/III ratio being set to 1500 to 2000 in order to further reduce the concentration of C. Thereby, the superlattice buffer layer 20 can be formed so that the impurity concentration in the upper layer 22a of the AlGaN layer 22 is higher than the impurity concentration in the AlN layer and the lower layer 22b of the AlGaN layer 22.

In the present embodiment, the impurity concentration in the upper layer 22a of the AlGaN layer 22 is preferably greater than or equal to $1\times10^{17}/cm^3$ and smaller than or equal to $1\times10^{18}/cm^3$. Additionally, the impurity concentration in the AlN layer 21 and the lower layer 22b of the AlGaN layer 22 is preferably greater than or equal to $5\times10^{18}/cm^3$ and smaller than or equal to $1\times10^{20}/cm^3$.

Figure 13C:
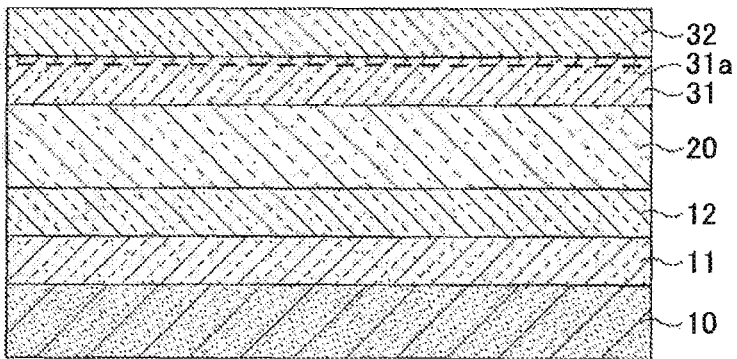

Then, as illustrated in FIG. 13C, the electron transit layer 31 and the electron supply layer 32 are laminated on the superlattice buffer layer 20. More specifically, the electron transit layer 31 is formed by causing a GaN film having a thickness of about 1 μm to grow on the superlattice buffer layer 20 under a condition in which a growth temperature is about 1000° C. and a pressure in the chamber of the MOCVD apparatus is about 100 to 300 mbar (10 to 30 kPa). The electron supply layer 32 is formed by causing a AlGaN film having a thickness of about 20 nm to grow on the electron transit layer 31 under a condition in which a growth temperature is about 1000° C. and a pressure in the chamber of the MOCVD apparatus is about 100 to 200 mbar (10 to 20 kPa). In the present embodiment, the electron supply layer 32 is formed by $Al_{0.2}Ga_{0.8}N$.

Figure 13D:
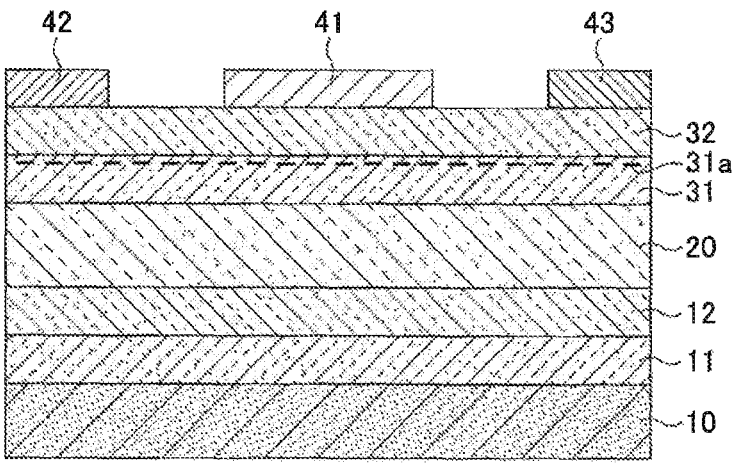

Then, as illustrated in FIG. 13D, the source electrode 42 and the drain electrode 43 are formed on the electron supply layer 32 and further the gate electrode 41 is formed on the electron supply layer 32. Specifically, a photoresist is applied onto the electron supply layer 32, and an exposure and development is performed by an exposure apparatus so as to form a resist pattern (not illustrated in the figure) having openings in areas where the source electrode 42 and the drain electrode 43 are to be formed. Thereafter, a metal lamination film made of a Ti/Al film is formed by a vacuum deposition. Then, the metal lamination film, formed on the resist pattern is removed together with the resist pattern by immersing the resist pattern into an organic solvent or the like. Thereby, the source electrode 42 and the drain electrode 43 are formed by remaining portions of the metal lamination film. Thereafter, a rapid thermal anneal (RTA) is performed to cause the source electrode 42 and the drain electrode 43 to make an ohmic contact with each other. It should be noted that in the metal lamination film made of Ti/Al film, the film thickness of the Ti film is about 100 nm and the film thickness of the Al film is about 300 nm.

Thereafter, a photoresist is applied on the electron supply layer 32 again, and an exposure and development is performed by an exposure apparatus so as to form a resist pattern (not illustrated in the figure) having an opening in an area where the gate electrode 41 is to be formed. Thereafter, a metal lamination film made of a Ni/Au film is formed by a vacuum deposition. Then, the metal lamination film formed on the resist pattern is removed together with the resist pattern by immersing the resist pattern into an organic solvent or the like. Thereby, the gate electrode 41 is formed by a remaining portion of the metal lamination film. It should be noted that in the metal lamination film made of Ni/Au film, the film thickness of the Ni film is about 50 nm and the film thickness of the Au film is about 300 nm.

The semiconductor device according to the present embodiment can be manufactured by the above-mentioned processes.

Second Embodiment

Figure 14:
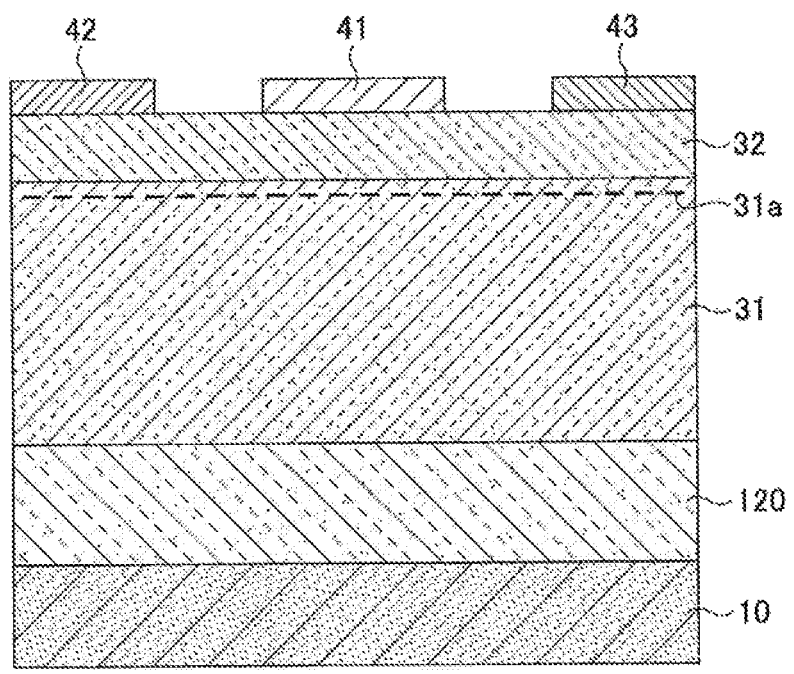
FIG. 14 is a cross-sectional view of a semiconductor device according to a second embodiment.

A description will now be given of a semiconductor device according to a second embodiment. The semiconductor device according to the second embodiment has a superlattice buffer layer having a structure different from that of the semiconductor device according to the first embodiment. As illustrated in FIG. 14, the semiconductor device according to the second embodiment includes a superlattice buffer layer 120, an electron transit layer 31 and an electron supply layer 32 that are sequentially laminated on a silicon substrate 10. A gate electrode 41, a source electrode 42 and a drain electrode 43 are formed on the electron supply layer 32. The superlattice buffer layer 120 may be formed on a nuclear formation layer (not illustrated in the figure) formed on the silicon substrate 10.

Figure 15A:
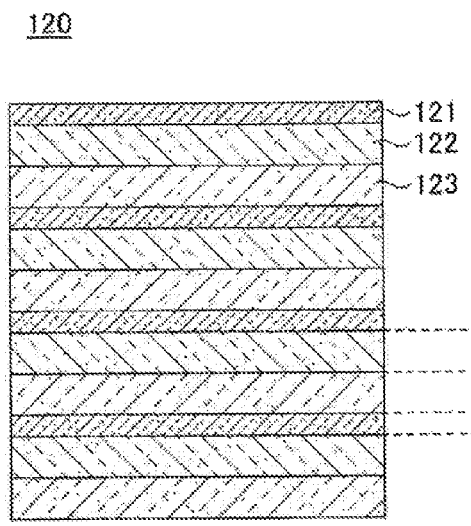
FIG. 15A is a cross-sectional view of a superlattice buffer layer of the semiconductor device according to the second embodiment.
Figure 15B:
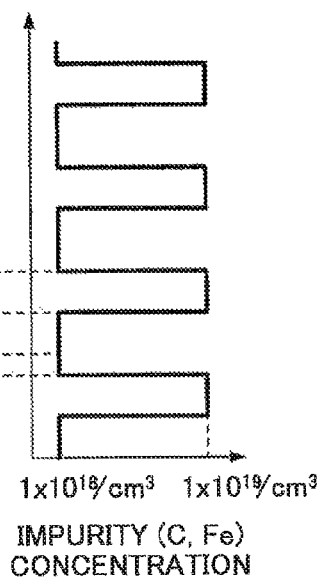
FIG. 15B is a graph indicating an impurity element density in the superlattice buffer layer illustrated in FIG. 15A.

FIG. 15A is an enlarged cross-sectional view of a portion of the superlattice buffer layer 120. As illustrated in FIG. 15B, the superlattice buffer layer 120 has a periodic structure in which an AlN layer 121, a first AlGaN layer 122 and a second AlGaN layer 123 are sequentially laminated. In the present embodiment, the AlN layer 121 may be referred to as a first superlattice formation layer, the first AlGaN layer 122 may be referred to as a second superlattice formation layer, and the second AlGaN layer 123 may be referred to as a third superlattice formation layer.

In the present embodiment, the first superlattice formation layer serving as the AlN layer 121 may be formed by $Al_xGa_{1-x}N$. The second superlattice formation layer serving as the first AlGaN layer 122 may be formed by $Al_yGa_{1-y}N$. The third superlattice formation layer serving as the second AlGaN layer 123 may be formed by $Al_zGa_{1-z}N$. In the present embodiment, a relationship $x>y>z$ is satisfied. That is, the second superlattice formation layer serving as the first AlGaN layer 122 has a band gap larger than that of the third superlattice formation layer serving as the second AlGaN layer 123. In the $Al_zGa_{1-z}N$ forming the third super lattice formation layer, a value of z may be greater than 0 and smaller than 0.5. In the present embodiment, the thickness of the AlN layer 121 is about 1.5 nm, the thickness of the first AlGaN layer 122 is about 10 nm, and the thickness of the second AlGaN layer 123 is about 10 nm.

The AlN layer 121, the first AlGaN layer 122 and the second AlGaN layer 123 are doped with an impurity element serving as an acceptor such as C, Fe, etc. The concentration of the impurity element in the first AlGaN layer 122 is higher than the concentration of the impurity element in the second AlGaN layer 123 and the AlN layer 121. Specifically, as illustrated in FIG. 15B, the concentration of the impurity element in the first AlGaN layer 122 is about $1\times10^{19}/cm^3$. The concentration of the impurity element in the second AlGaN layer 123 and the AlN layer 121 is about $1\times10^{18}/cm^3$.

In the present embodiment, for example, the first AlGaN layer 122 is formed by $Al_{0.2}Ga_{0.8}N$, and the second AlGaN layer 123 is formed by $Al_{0.1}Ga_{0.9}N$. Thus, a band gap of the first AlGaN layer 122, which corresponds to the upper layer in the first embodiment, is made larger than a band gap of the second AlGaN layer 123, which corresponds to the lower layer, and, thereby, electrons are further prevented from being pooled.

As a method of making different composition ratios between the first AlGaN layer 122 and the second AlGaN layer 123, a V/III ratio is adjusted when making a growth in the MOCVD apparatus.

The configurations of the second embodiment other than the above-mentioned configuration are the same as the first embodiment.

Third Embodiment

Figure 16:
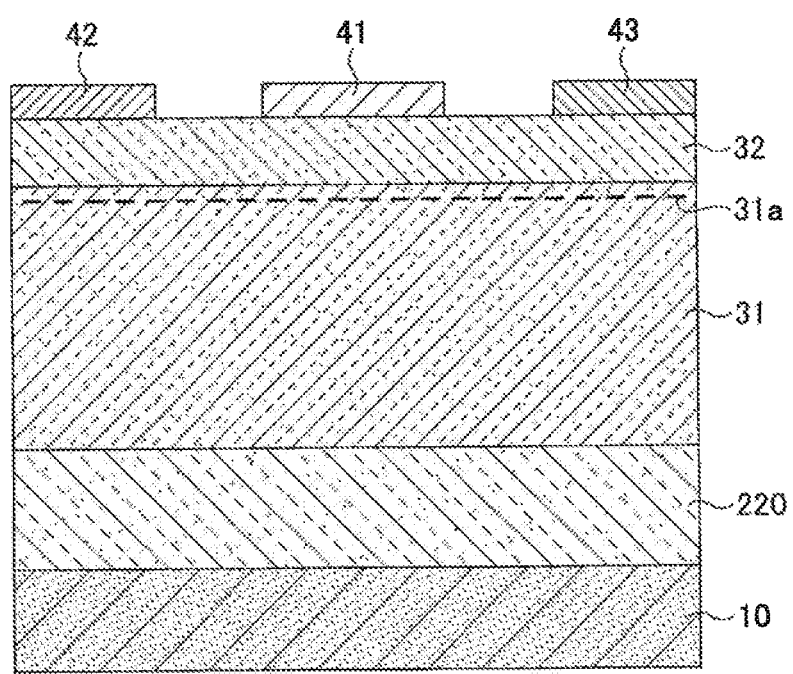
FIG. 16 is a cross-sectional view of a semiconductor device according to a third embodiment.

A description will now be given of a semiconductor device according to a third embodiment. The semiconductor device according to the third embodiment has a superlattice buffer layer having a structure different from those of the semiconductor devices according to the first and second embodiments. As illustrated in FIG. 16, the semiconductor device according to the third embodiment includes a superlattice buffer layer 220, an electron transit layer 31 and an electron supply layer 32 that are sequentially laminated on a silicon substrate 10. A gate electrode 41, a source electrode 42 and a drain electrode 43 are formed on the electron supply layer 32. The superlattice buffer layer 220 may be formed on a nuclear formation layer (not illustrated in the figure) formed on the silicon substrate 10.

Figure 17A:
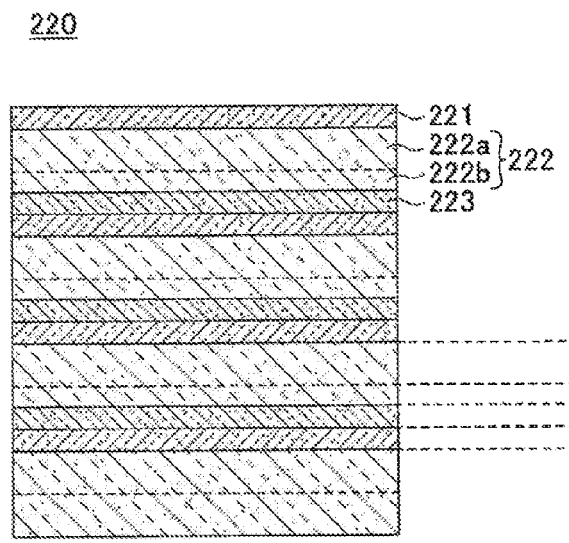
FIG. 17A is a cross-sectional view of a superlattice buffer layer of the semiconductor device according to the third embodiment.
Figure 17B:
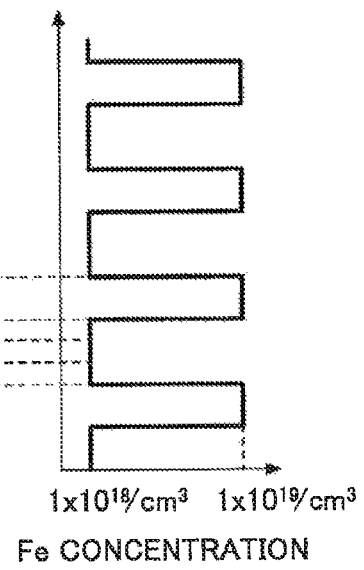
FIG. 17B is a graph indicating an impurity element density in the superlattice buffer layer illustrated in FIG. 17A.

FIG. 17A is an enlarged cross-sectional view of a portion of the superlattice buffer layer 220. As illustrated in FIG. 17B, the superlattice buffer layer 220 has a periodic structure in which an AlN layer 221, an AlGaN layer 222 and an InGaN layer 223 are sequentially laminated. The AlGaN layer 22 includes an upper layer 222a and a lower layer 222b. The upper layer 222a is situated on the side of the electron transit layer 31 and is in contact with the AlN layer 221. The lower layer 22b is situated on the side of the silicon substrate 10. In the present embodiment, the AlN layer 221 may be referred to as a first superlattice formation layer, the first AlGaN layer 222 may be referred to as a second superlattice formation layer, and the InGaN layer 223 may be referred to as a third superlattice formation layer.

In the present embodiment, the first superlattice formation layer serving as the AlN layer 221 may be formed by $Al_xGa_{1-x}N$. The value of x may be greater than or equal to 0.5 and smaller than or equal to 1. The second superlattice formation layer serving as the AlGaN layer 222 may be formed by $Al_yGa_{1-y}N$. The value of y may be greater than 0 and smaller than 0.5. Accordingly, a relationship $x>y$ is satisfied in the superlattice buffer layer 220. As the impurity element serving as an acceptor doped into the superlattice buffer layer 220, Mg, Zn, Be, Cd, Li, etc., other than C and Fe may be used.

An impurity element serving as an acceptor such as C, Fe, etc., is doped into the AlN layer 221, the AlGaN layer 222 and the InGaN layer 223. In the present embodiment, the impurity element is doped so that the concentration of the impurity element in the upper layer 222a of the AlGaN layer 222 is higher than the concentration of the impurity element in the lower layer 222b of the AlGaN layer 222, the AlN layer 221 and the InGaN layer 223.

Specifically, as illustrated in FIG. 17B, the concentration of the impurity element in the upper layer 222a of the AlGaN layer 222 is about $1\times10^{19}/cm^3$. The concentration of the impurity element in the lower layer 222b of the AlGaN layer 222, the AlN layer 221 and the InGaN layer 223 is about $1\times10^{18}/cm^3$. In the present embodiment, for example, the AlGaN layer 222 is formed by $Al_{0.1}Ga_{0.9}N$, and the InGaN layer 223 is formed by $In_{0.1}Ga_{0.9}N$. The thickness of the AlN layer 221 is about 1.5 nm, the thickness of the AlGaN layer 222 is about 20 nm, and the thickness of the InGaN layer 223 is about 2 nm. FIG. 18 is an energy band diagram of the superlattice buffer layer 220.

In the meantime, when Fe is doped as an impurity element into the superlattice buffer layer, Fe may be diffused into the electron transit layer 31 during a heat treatment process or a film growth process. Such a diffusion of Fe into the electron transit layer 31 causes deterioration in the performance of the semiconductor device. In the semiconductor device according to the present embodiment, a diffusion of Fe is suppressed by forming the InGaN layer 223 in the superlattice buffer layer 220. That is, because the InGaN layer 223 has a large lattice constant, a diffusion of Fe doped as an impurity element can be suppressed. The InGaN layer 223 serves as a barrier layer. Thereby, when Fe is doped as an impurity element into the superlattice buffer layer 220, Fe is prevented from being diffused into the electron transit layer 31. Thus, in the present embodiment, generation of a warp in the silicon substrate 10 and a leak current flowing in the semiconductor device can be suppressed without deterioration of the characteristics as a semiconductor device.

It should be noted that, in the present embodiment, InAlGaN may be used instead of InGaN as a material to form the InGaN layer 223. When forming the InGaN layer 223, trimethyl indium (TMI) is used as a source gas to be supplied. Configurations other than the above-mentioned configuration are the same as the first embodiment.

Fourth Embodiment

Figure 19:
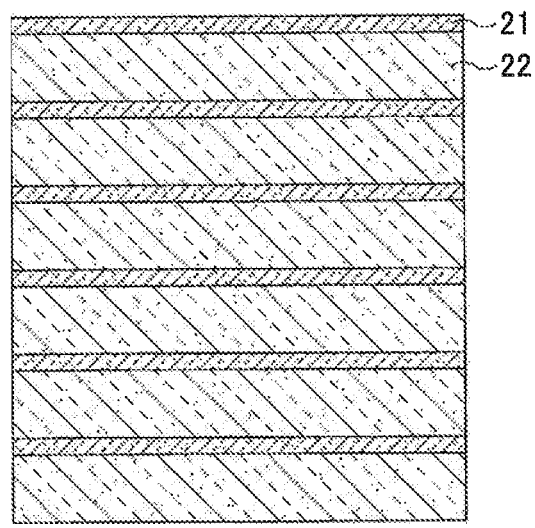
FIG. 19 is a cross-sectional view of a superlattice buffer layer according to a fourth embodiment.

A description will now be given of a semiconductor device according to a fourth embodiment. In the above-mentioned semiconductor device, the leak current flowing in a vertical direction to the silicon substrate can be suppressed by thickening the superlattice buffer layer. However, if the superlattice buffer layer is thick, a warp of the silicon substrate becomes large. A description is given below of a result of consideration of a case where the superlattice buffer layer 20 is formed by alternately laminating the AlN layer 21 (first superlattice formation layer) and the AlGaN layer 22 (second superlattice formation layer) as illustrated in FIG. 19. Specifically, consideration is given of a case where the film thickness of the AlN layer 21 (first superlattice formation layer) is varied in the superlattice buffer layer 20.

Figure 20:
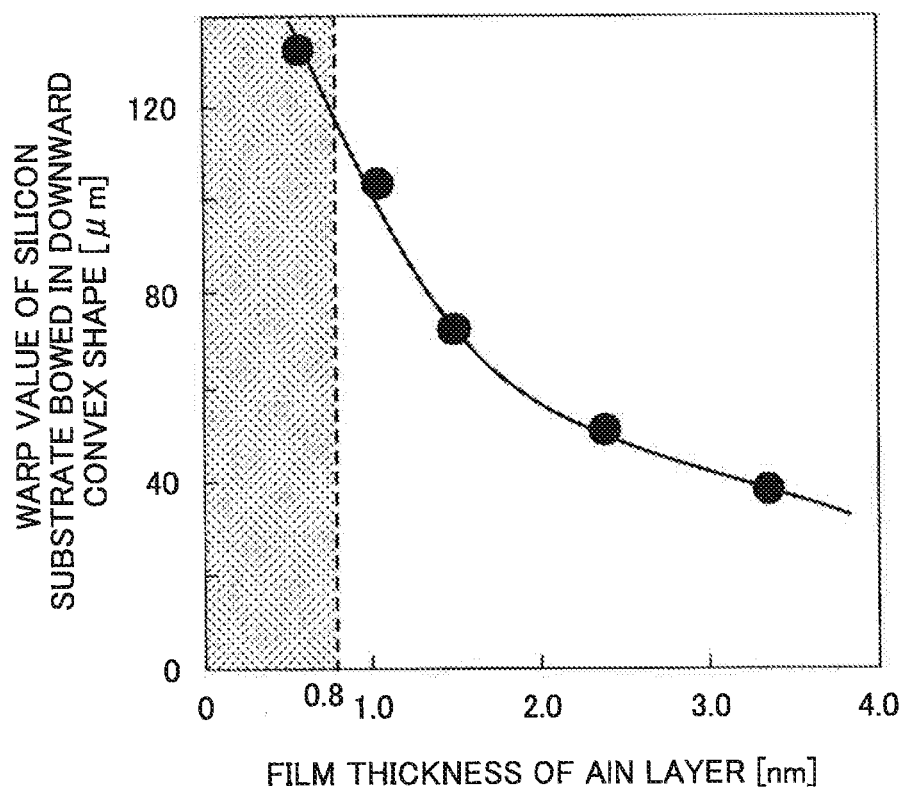
FIG. 20 is a graph indicating a relationship between a film thickness of an AlN layer and a warp value of silicon substrate bowed in a downward convex shape.

FIG. 20 is a graph indicating a relationship between the film thickness of the AlN layer 21 (first superlattice formation layer) in the superlattice buffer layer 20 and a warp value of a deformation of the silicon substrate 10. As illustrated in FIG. 20, a warp in the silicon substrate can be reduced by increasing the film thickness of the AlN layer 21 (first superlattice formation layer) in the superlattice buffer layer 20. If the film thickness of the AlN layer 21 is smaller than 0.8 nm, the warp value of the silicon substrate 10 is greater than or equal to 120 μm, which is not preferable because a crack may be generated in the superlattice buffer layer 20 and the nitride semiconductor formed on the superlattice buffer layer 20. Thus, the film thickness of the AlN layer 21 (first superlattice formation layer) is preferably greater than or equal to 0.8 nm.

Figure 21:
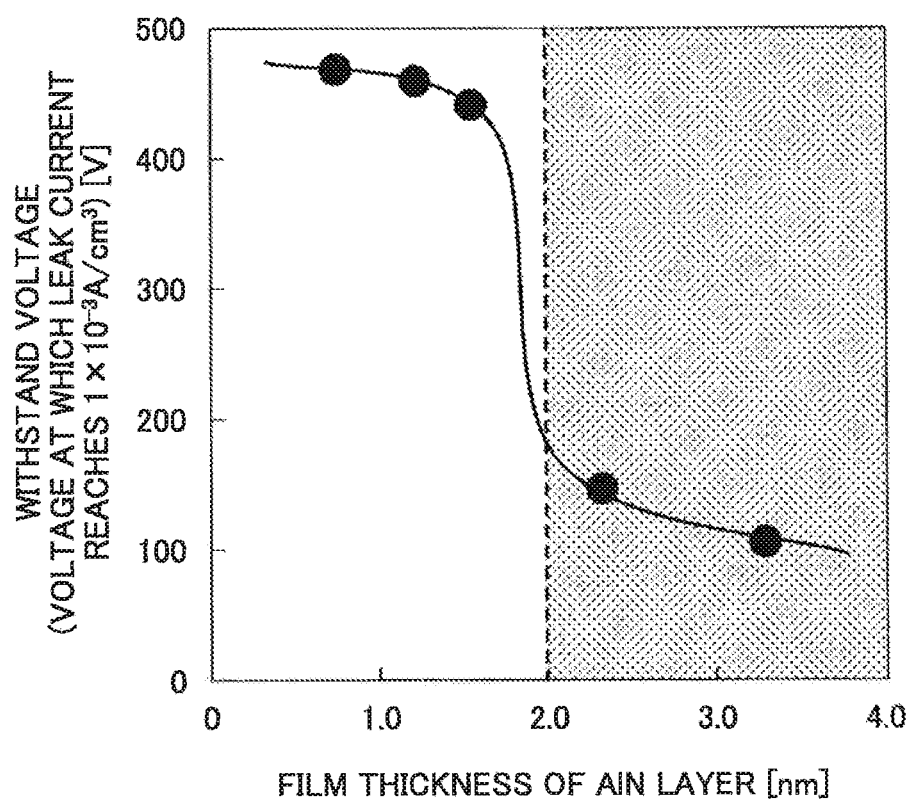
FIG. 21 is a graph indicating a relationship between a film thickness of an AlN layer and a withstand voltage.

FIG. 21 is a graph indicating a relationship between the film thickness and the withstand voltage of the AlN layer 21 (first superlattice formation layer) in the superlattice buffer layer 20. In the present embodiment, the withstand voltage is defined as a voltage at which the leak current becomes $1\times10^{-3}$ A/cm$^2$. As illustrated in FIG. 21, the withstand voltage is decreased by increasing the film thickness of the AlN layer 21 (first superlattice formation layer) in the superlattice buffer layer 20. Particularly, when the film thickness of the ALN layer 21 is around 2.0 nm, if the film thickness of the AlN layer 21 is increased, the withstand voltage is sharply decreased. When the thickness of the AlN layer 21 exceeds 2.0 nm, the withstand voltage becomes smaller than 200 V, which is not preferable. Thus, it is preferable that the film thickness of the AlN layer 21 (first superlattice formation layer) is smaller than or equal to 2.0 nm.

Figure 22:
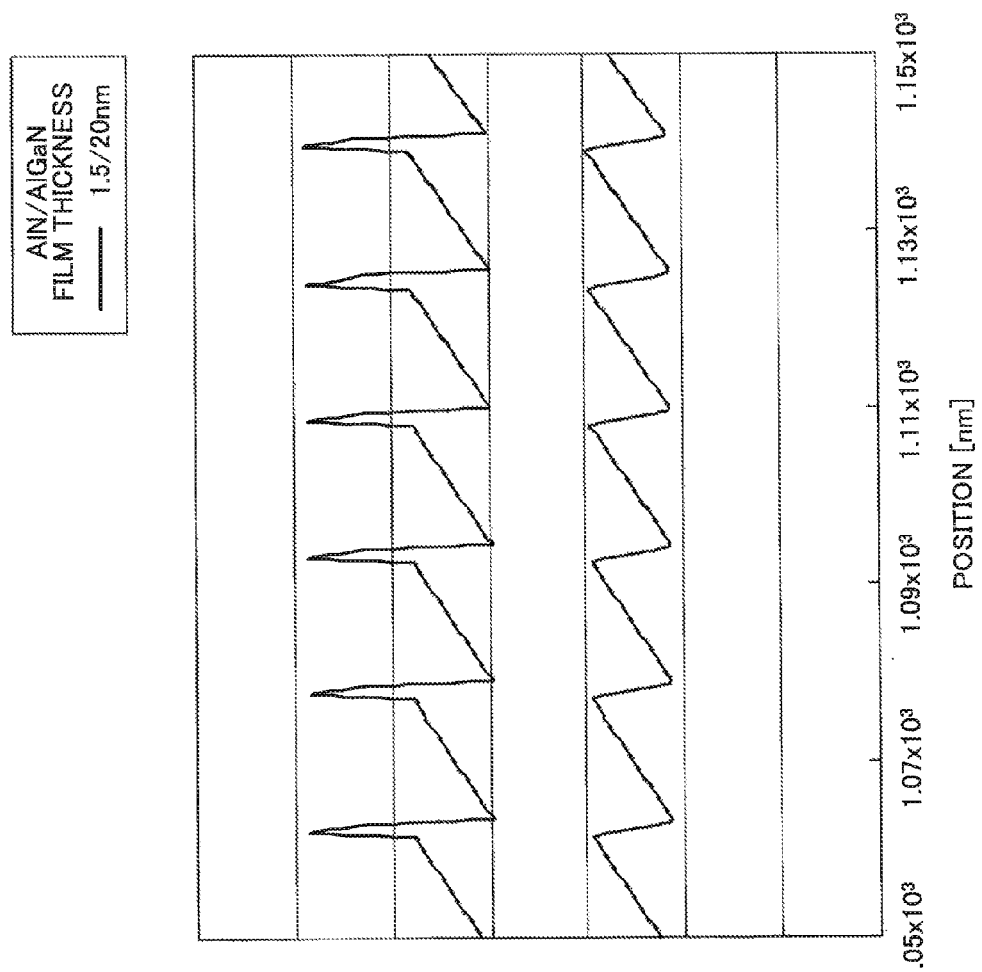
FIG. 22 is a graph indicating an energy band of a superlattice buffer layer in which an AlN layer has a different film thickness.
Figure 23:
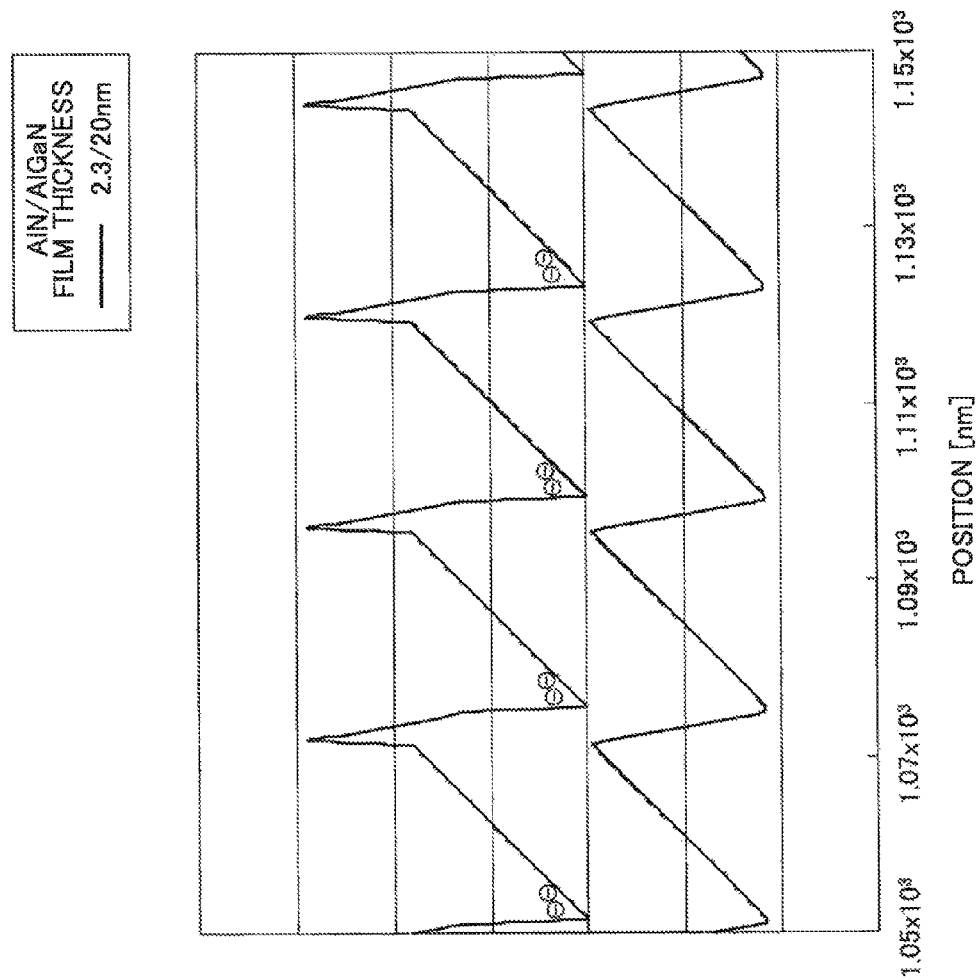
FIG. 23 is a graph indicating an energy band of a superlattice buffer layer in which an AlN layer has a further different film thickness.

A description will be given below, with reference to FIGS. 22 and 23, of a change in the withstand voltage caused by a change in the film thickness of the AlN layer 21 in the superlattice buffer layer 20. FIG. 22 is an energy band diagram of the superlattice buffer layer 20, which is formed by alternately laminating the AlN layer 21 having the film thickness of 1.5 nm and the AlGaN layer 22 having the film thickness of 20 nm. FIG. 23 is an energy band diagram of the superlattice buffer layer 20, which is formed by alternately laminating the AlN layer 21 having the film thickness of 2.3 nm and the AlGaN layer 22 having the film thickness of 20 nm. The lower ends of conducting bands in the graph of FIG. 23 are positioned lower than the lower ends of conducting bands in the graph of FIG. 22. Because electrons tend to be pooled at the lower ends of conducting bands, the superlattice buffer layer 20 of FIG. 23 has a withstand voltage lower than the superlattice buffer layer 20 of FIG. 22.

As mentioned above, when the film thickness of the AlN layer 21 is varied, a warp of the silicon substrate 10 and a withstand voltage are in a trade-off relation. Based on the relationship between a warp of the silicon substrate 10 and the withstand voltage, it is preferable that the film thickness of the AlN layer 21 (first superlattice formation layer) in the superlattice buffer layer 20 is greater than or equal to 0.8 nm and smaller than or equal to 2.0 nm.

Figure 24:
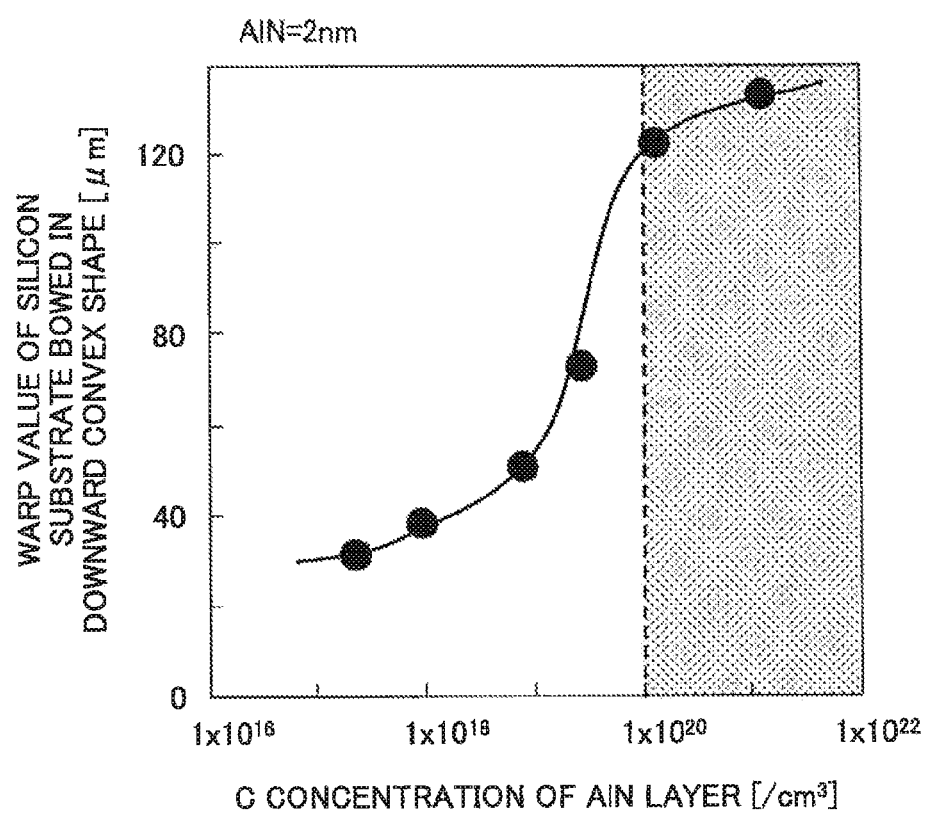
FIG. 24 is a graph indicating a relationship between a carbon (C) concentration of an AlN layer and a warp value of a silicon substrate bowed in a downward convex shape.

A description will be given, with reference to FIG. 24, of a relationship between a concentration of an impurity element C doped into the AlN layer 21 and a warp of the silicon substrate 10. FIG. 24 is a graph indicating a relationship between the concentration of the impurity element C doped into the AlN layer 21 (first superlattice formation layer) and a warp value of a deformation of the silicon substrate 10 in the superlattice buffer layer 20. The film thickness of the AlN layer 21 is 2 nm.

As illustrated in FIG. 24, a warp in the silicon substrate 10 becomes large when the concentration of C in the AlN layer 21 (first superlattice formation layer) in the superlattice buffer layer 20 is increased. If the concentration of C in the AlN layer 21 exceeds $1\times10^{20}$/cm$^3$, the warp value of the warp of the silicon substrate 10 becomes greater than or equal to 120 μm, which is not preferable because a crack may be generated in the film. Thus, the concentration of C, which is an impurity element doped into the AlN layer 21 (first superlattice formation layer) in the superlattice buffer layer 20, is preferably smaller than or equal to $1\times10^{20}$/cm$^3$. It should be noted that a desired withstand voltage cannot be obtained unless certain amount of C is doped into the AlN layer 21. Thus, it is preferable that the concentration of C, which is an impurity element doped into the AlN layer 21 (first superlattice formation layer) in the superlattice buffer layer 20, is greater than or equal to $1\times10^{17}$/cm$^3$.

As mentioned above, based on the relationship between a warp of the silicon substrate 10 and a withstand voltage, it is preferable that the concentration of C, which is an impurity element doped into the AlN layer 21 (first superlattice formation layer) in the superlattice buffer layer 20, is greater than or equal to $1\times10^{17}$/cm$^3$ and smaller than or equal to $1\times10^{20}$/cm$^3$.

A description will be given below, with reference to FIG. 25, of a relationship between a concentration of an impurity element Fe doped into the AlN layer 21 and a warp of the silicon substrate 10. FIG. 25 is a graph indicating a relationship between a concentration of an impurity element Fe doped into the AlN layer 21 (first superlattice formation layer) and a warp value of a deformation of the silicon substrate 10 in the superlattice buffer layer 20. The film thickness of the AlN layer 21 (first superlattice formation layer) is 2 nm. C as an impurity element is doped into the AlN layer 21 at a concentration of $1\times10^{18}/cm^3$.

As illustrated in FIG. 25, a warp in the silicon substrate 10 becomes large when the concentration of Fe in the AlN layer 21 (first superlattice formation layer) in the superlattice buffer layer 20 is increased. If the concentration of Fe in the AlN layer 21 exceeds $1\times10^{20}/cm^3$, the warp value of the warp of the silicon substrate 10 becomes greater than or equal to 120 μm, which is not preferable because a crack may be generated in the film. Thus, the concentration of Fe, which is an impurity element doped into the AlN layer 21 (first superlattice formation layer) in the superlattice buffer layer 20, is preferably smaller than or equal to $1\times10^{19}/cm^3$.

Thus, in the present embodiment, in the case where the film thickness of the AlN layer 21 in the superlattice buffer layer 20 is greater than or equal to 0.8 nm and smaller than or equal to 2.0 nm, if the impurity element doped into the AlN layer 21 is C, the concentration of C is greater than or equal to $1\times10^{17}/cm^3$ and smaller than or equal to $1\times10^{20}/cm^3$. Moreover, in the case where the film thickness of the AlN layer 21 in the superlattice buffer layer 20 is greater than or equal to 0.8 nm and smaller than or equal to 2.0 nm, if the impurity element doped into the AlN layer 21 is Fe, the concentration of Fe is smaller than or equal to $1\times10^{19}/cm^3$. The semiconductor device according to the present embodiment includes the superlattice buffer layer 20 having the above-mentioned AlN layer 21.

In the present embodiment, the first superlattice formation layer serving as the AlN layer 21 may be formed by $Al_xGa_{1-x}N$, and the value of x may be greater than or equal to 0.5 and smaller than or equal to 1. The second superlattice formation layer serving as the AlGaN layer 22 may be formed by $Al_yGa_{1-y}N$, and the value of y may be greater than 0 and smaller than 0.5. Accordingly, a relationship $x > y$ is satisfied in the superlattice buffer layer 20. More preferably, the first superlattice formation layer is formed by AlN. As the impurity element serving as an acceptor doped into the superlattice buffer layer 20, Mg, Zn, Be, Cd, Li, etc., other than C and Fe may be used.

Manufacturing Method of Semiconductor Device

A description will now be given, with reference to FIGS. 26A through 26D, of a manufacturing method of the semiconductor device according to the present embodiment. According to the manufacturing method of the semiconductor device of the present embodiment, the nitride semiconductor layer is formed on the silicon substrate 10 by epitaxial growth using a metal organic chemical vapor deposition (MOCVD) or a molecular beam epitaxy (MBE). In the following explanation, it is assumed that the nitride semiconductor layer is formed by MOCVD. When forming the nitride semiconductor layer, trimethyl aluminum (TMA) is used as an Al source gas, trimethyl gallium (TMG) is used as a Ga source gas, and ammonium ($NH_3$) is used as a N source gas.

Figure 26A:
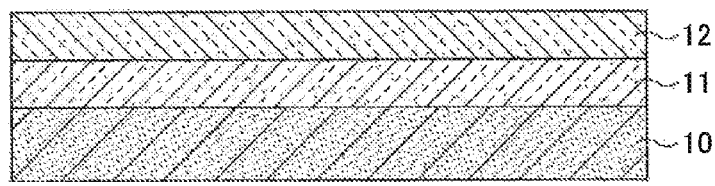
FIGS. 26A through 26D are cross-sectional views for explaining a manufacturing method of the semiconductor device according to the fourth embodiment.

First, as illustrated in FIG. 26A, a nuclear formation layer 11 and a buffer layer 12 are formed by a nitride semiconductor sequentially on the silicon substrate 10. Although a silicon (111) substrate is used as the silicon substrate 10 in the present embodiment, a substrate formed of SiC, sapphire, GaN, etc., may be used instead of the silicon substrate 10. The nuclear formation layer 11 is formed of an AlN film having a thickness of 200 nm. The buffer layer 12 is formed by $Al_{0.4}Ga_{0.6}N$.

The nuclear formation layer 11 is formed by causing growth in a condition in which a substrate temperature is about 1000° C., a V/III ratio is 1000 to 2000, and a pressure in a chamber of an MOCVD apparatus is about 50 mbar (5 kPa). The buffer layer 12 is formed by causing growth in a condition in which a substrate temperature is about 1000° C., a V/III ratio is 100 to 300, and a pressure in a chamber of an MOCVD apparatus is about 50 mbar (5 kPa). In the present embodiment, it is preferable to cause a growth of the nuclear formation layer 11 by a condition with which an amount of C taken into the film is small. As for the buffer layer 12, in order to achieve flatness, it is preferable to cause a growth in a condition in which the V/III ratio is decreased.

Figure 26B:
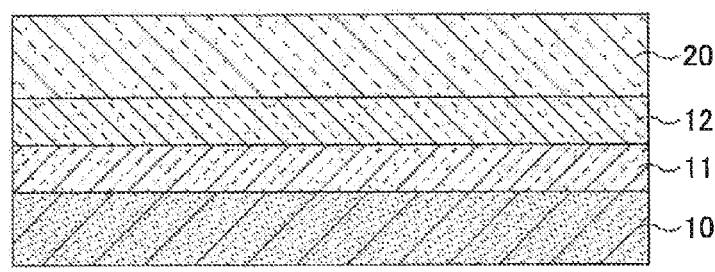

Then, as illustrated in FIG. 26B, the superlattice layer 20 is formed on the buffer layer 12. Specifically, as illustrated in FIG. 19, the superlattice buffer layer 20 is formed by alternately and periodically laminating the AlN layer 21 and the AlGaN layer 22. The thus-formed AlN layer 21 has a film thickness of about 1.5 nm. The AlGaN layer 22 has a film thickness of about 20 nm. It is preferable to make a thickness of the AlN layer 21 to be smaller than or equal to 2 nm. Additionally, the thickness of the AlN layer 21 is preferably greater than or equal to 0.8 nm in order to reduce a warp of the silicon substrate 10. The AlGaN layer 22 is formed by $Al_{0.2}Ga_{0.8}N$. A temperature of the substrate when forming the superlattice buffer layer 20 is about 1020° C. The superlattice buffer layer 20 is formed by causing a growth in a condition in which a pressure in the chamber of the MOCVD apparatus is about 50 mbar (5 kPa).

According to the present embodiment, C is used as an impurity element serving as an acceptor doped into the AlN layer 21. A mixing amount of C is adjusted by changing a V/III ratio. Specifically, in order to set the concentration of C in the AlN layer 21, the AlN layer 21 is caused to grow in a condition in which the V/III ratio is about 600. It should be noted that the impurity concentration in the AlN layer 21 is preferably greater than or equal to $1\times10^{17}/cm^3$ and smaller than or equal to $1\times10^{20}/cm^3$.

Figure 26C:
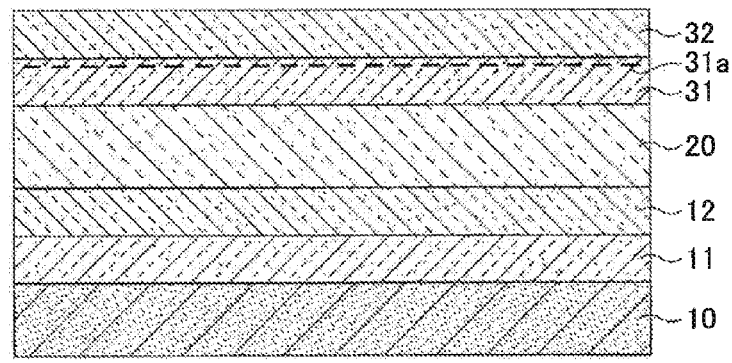

Then, as illustrated in FIG. 26C, the electron transit layer 31 and the electron supply layer 32 are laminated on the superlattice buffer layer 20. More specifically, the electron transit layer 31 is formed by causing a GaN film having a thickness of about 1 μm to grow on the superlattice buffer layer 20 under a condition in which a growth temperature is about 1000° C. and a pressure in the chamber of the MOCVD apparatus is about 100 to 300 mbar (10 to 30 kPa). The electron supply layer 32 is formed by causing an AlGaN film having a thickness of about 20 nm to grow on the electron transit layer 31 under a condition in which a growth temperature is about 1000° C. and a pressure in the chamber of the MOCVD apparatus is about 100 to 200 mbar (10 to 20 kPa). In the present embodiment, the electron supply layer 32 is formed by $Al_{0.2}Ga_{0.8}N$.

Figure 26D:
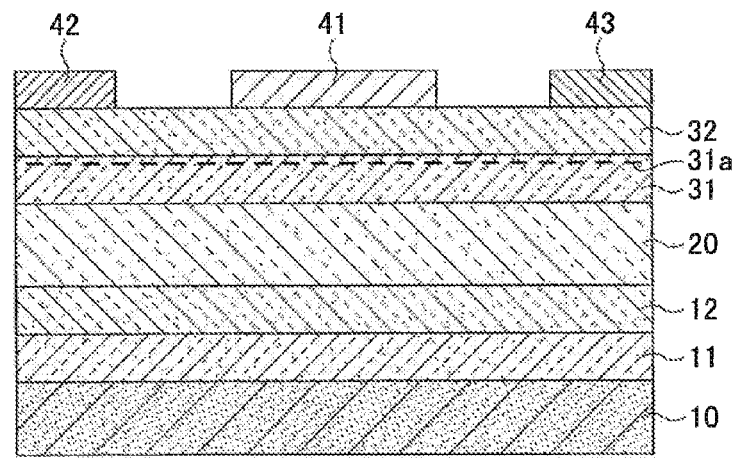

Then, as illustrated in FIG. 26D, the source electrode 42 and the drain electrode 43 are formed on the electron supply layer 32 and further the gate electrode 41 is formed on the electron supply layer 32. Specifically, a photoresist is applied on the electron supply layer 32, and an exposure and development is performed by an exposure apparatus so as to form a resist pattern (not illustrated in the figure) having openings in areas where the source electrode 42 and the drain electrode 43 are to be formed. Thereafter, a metal lamination film made of a Ti/Al film is formed by a vacuum deposition. Then, the metal lamination film formed on the resist pattern is removed together with the resist pattern by immersing the resist pattern into an organic solvent or the like. Thereby, the source electrode 42 and the drain electrode 43 are formed by remaining portions of the metal lamination film. Thereafter, a rapid thermal anneal (RTA) is performed to cause the source electrode 42 and the drain electrode 43 to make an ohmic contact with each other. It should be noted that in the metal lamination film made of Ti/Al film, the film thickness of the Ti film is about 100 nm and the film thickness of the Al film is about 300 nm.

Thereafter, a photoresist is applied on the electron supply layer 32 again, and an exposure and development is performed by an exposure apparatus so as to form a resist pattern (not illustrated in the figure) having an opening in an area where the gate electrode 41 is to be formed. Thereafter, a metal lamination film made of a Ni/Au film is formed by a vacuum deposition. Then, the metal lamination film formed on the resist pattern is removed together with the resist pattern by immersing the resist pattern into an organic solvent or the like. Thereby, the gate 41 is formed by a remaining portion of the metal lamination film. It should be noted that in the metal lamination film made of Ni/Au film, the film thickness of the Ni film is about 50 nm and the film thickness of the Au film is about 300 nm.

The semiconductor device according to the present embodiment can be manufactured by the above-mentioned processes.

It should be noted that, in the present embodiment, when forming the AlN layer 21 in the superlattice buffer layer 20, Fe may be doped as an impurity element serving as an acceptor. In such a case, the concentration of Fe doped is preferably smaller than or equal to $1 \times 10^{19}/cm^3$. For Example, the concentration of Fe is preferably $1 \times 10^{18}/cm^3$. As a source gas when doping Fe, for example, ferrocene (Cp2Fe) is used. Manufacturing processes other than the above-mentioned processes are the same as the manufacturing method of the semiconductor device according to the first embodiment.

Fifth Embodiment

A description will be given below of a semiconductor device, power supply device and high-frequency amplifier according to a fifth embodiment.

Figure 27:
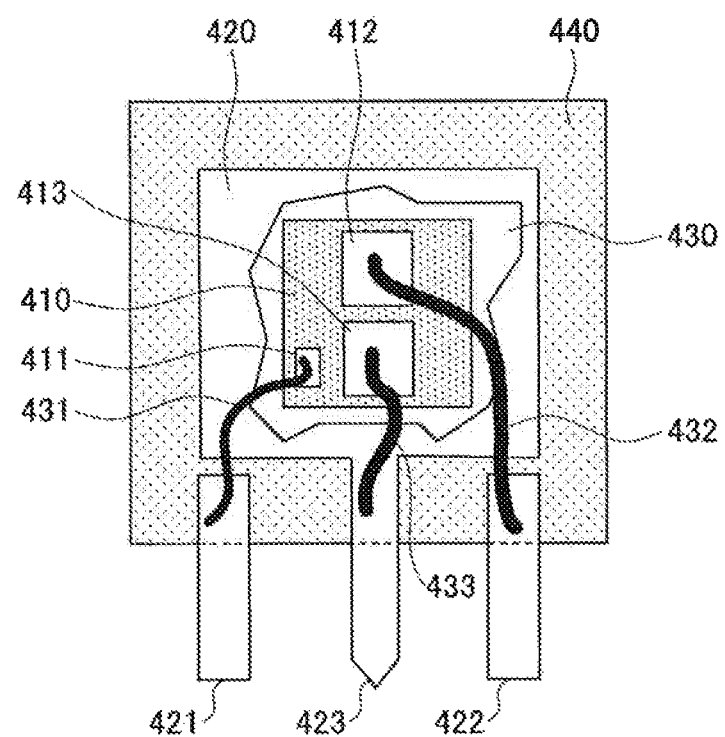
FIG. 27 is a plan view of an interior of a semiconductor device according to a fifth embodiment.

The semiconductor device according to the fifth embodiment includes one of the semiconductor devices according to the first through fourth embodiments that is incorporated into a discrete package. The discrete-packaged semiconductor device is described with reference to FIG. 27. FIG. 27 schematically illustrates an interior of the discrete-packaged semiconductor device. The configuration and arrangement of the electrodes of the semiconductor device incorporated in the discrete package are different from those of the semiconductor devices according to the first through fourth embodiments.

First, an HEMT semiconductor chip 410 of GaN semiconductor material is formed by one of the semiconductor devices according to the first through four embodiments. Then, the semiconductor chip 410 is fixed on a lead frame 420 by a die-attachment agent 430 such as solder or the like. The semiconductor chip 410 corresponds to one of the semiconductor device according to the first through fourth embodiments.

Then, a gate electrode 411 is connected to a gate lead 421 by a bonding wire 431, a source electrode 412 is connected to a source lead 422 by a bonding wire 432 and a drain electrode 413 is connected to a drain lead 423 by a bonding wire 433.

The bonding wires 431, 432 and 433 are made of a metal material such as Al or the like. In the present embodiment, the gate electrode 411 is a gate electrode pad, which is connected to the gate electrode 41 of one of the semiconductor devices according to the first through fourth embodiments. The source electrode 412 is a source electrode pad, which is connected to the source electrode 42 of one of the semiconductor devices according to the first through fourth embodiments. The drain electrode 413 is a drain electrode pad, which is connected to the drain electrode 43 of one of the semiconductor devices according to the first through fourth embodiments.

Then, the semiconductor chip 410 and the lead frame 420 are encapsulated by a mold resin 440 using a transfer mold method. As mentioned above, the discrete-packaged semiconductor device, which is an HEMT using GaN semiconductor material, is fabricated.

A description is given of a power supply device and a high-frequency amplifier according to the fifth embodiment. The power supply device and the high-frequency amplifier according to the fifth embodiment incorporate therein one of the semiconductor devices according to the first through fourth embodiments.

Figure 28:
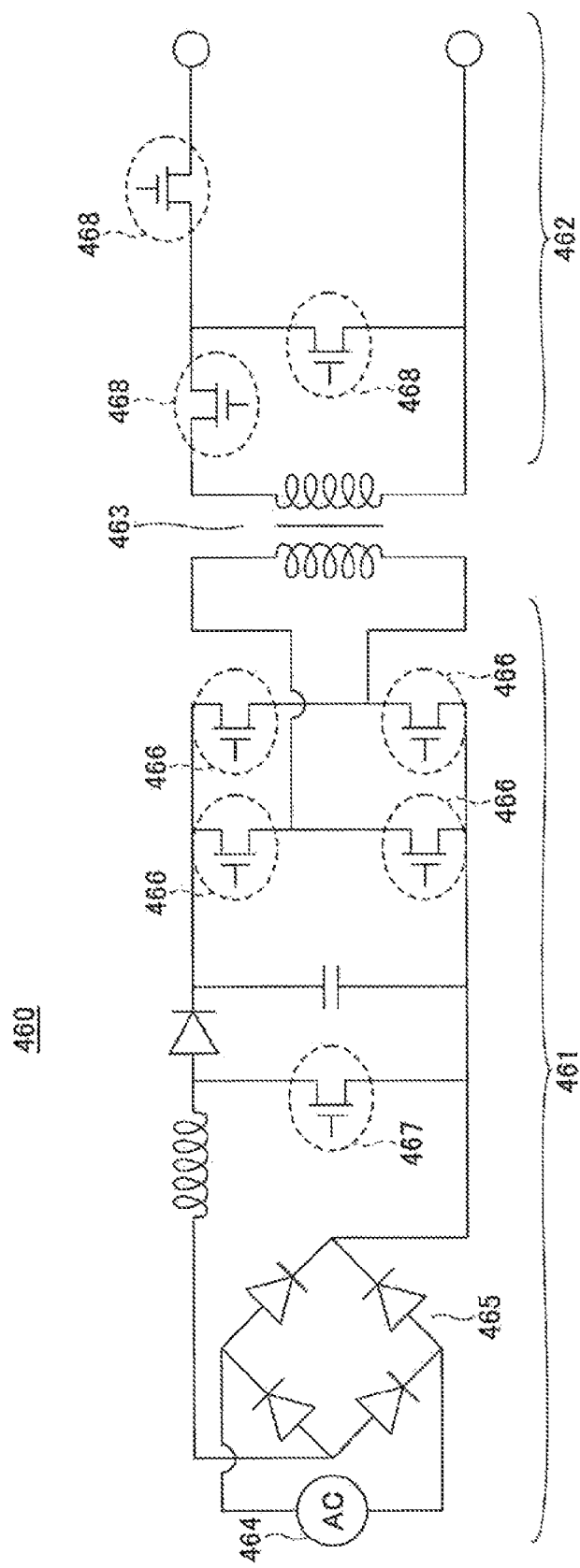
FIG. 28 is a circuit diagram of a power supply device according to the fifth embodiment.

First, a description is given, with reference to FIG. 28, of a power supply device according to the fifth embodiment. The power supply device 460 according to the fifth embodiment includes a primary circuit 461 of a high-voltage, a secondary circuit 461 of a low-voltage, and a transformer 463 provided between the primary circuit 461 and the secondary circuit 462. The primary circuit 461 includes an alternating-voltage power source 464, a so-called bridge rectifying circuit 465, a plurality of switching devices 466 (four switching devices are illustrated in FIG. 28) and another switching device 467. The secondary circuit 462 includes a plurality of switching devices 468 (three switching devices are illustrated in FIG. 28). In the power supply device 460 illustrated in FIG. 28 semiconductor devices according to the first through fourth embodiments are used as the switching devices 466 and 467 of the primary circuit 461. The switching devices 466 and 467 of the primary circuit 461 are preferably normally-off semiconductor devices. A metal insulator semiconductor filed effect transistor (MISET) is used as the switching device 468 of the secondary circuit 462.

Figure 29:
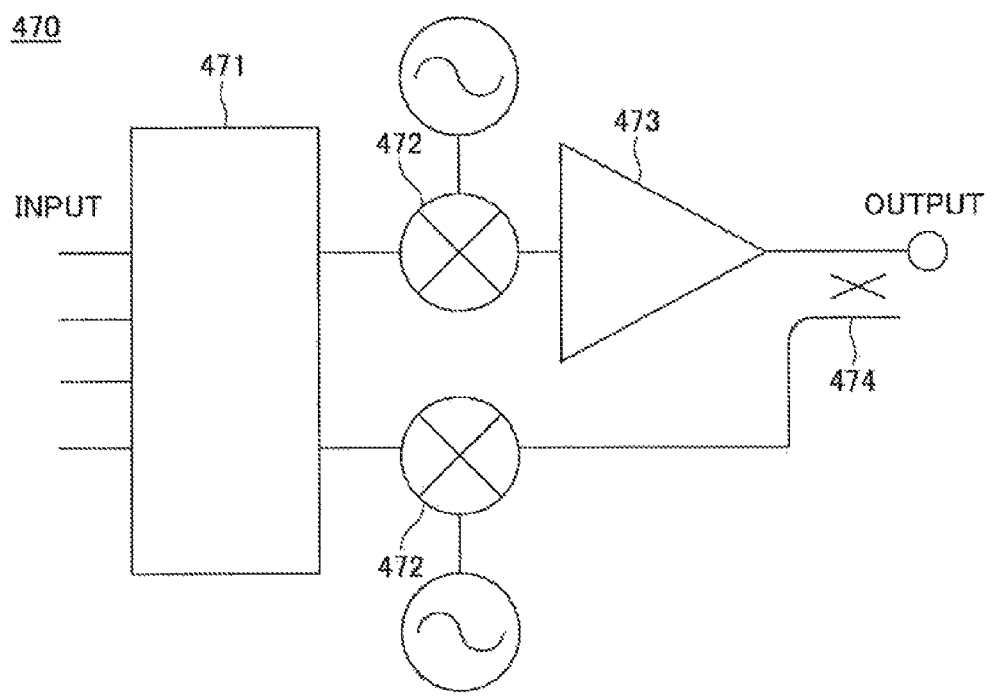
FIG. 29 is a circuit diagram of a high-power amplifier according to the fifth embodiment.

A description is given below, with reference to FIG. 29, of a high-frequency amplifier according to the fifth embodiment. The high-frequency amplifier 470 according to the present embodiment may be applied to, for example, a power amplifier of a base station of a cellular phone system. The high-frequency amplifier 470 includes a digital predistortion circuit 471, a mixer 472, a power amplifier 473 and a directional coupler 474. The digital predistortion circuit 471 compensates for a linear distortion of an input signal. The mixer 472 mixes the input signal of which a linear distortion is compensated and an alternating current signal. The power amplifier 473 amplifies the input signal mixed with the alternating current signal. In the circuit illustrated in FIG. 29, the power amplifier 473 includes one of the semiconductor devices according to the first through fourth embodiments. The directional coupler 474 monitors the input signal and an output signal. In the circuit illustrated in FIG. 29, for example, an output signal can be mixed with the alternating current signal by the mixer 472 and can be sent to the digital predistortion circuit 471.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor device comprising:
   a superlattice buffer layer formed on a substrate;
   a first semiconductor layer formed by a nitride semiconductor on said superlattice buffer layer;
   a second semiconductor layer formed by a nitride semiconductor on said first semiconductor layer; and
   a gate electrode, a source electrode and a drain electrode formed on said second semiconductor layer,
   wherein said superlattice buffer layer is formed by alternately and periodically laminating a first superlattice formation layer and a second superlattice formation layer,
   said first superlattice formation layer is formed by $Al_xGa_{1-x}N$ and said second superlattice formation layer is formed by $Al_yGa_{1-y}N$, where a relationship x>y is satisfied, and
   a concentration of an impurity element serving as an acceptor doped into a portion or a whole of said second superlattice formation layer is higher than a concentration of the impurity element serving as an acceptor doped into said first superlattice formation layer.

2. The semiconductor device as claimed in claim 1, wherein said second superlattice formation layer includes an upper layer on a side of said first semiconductor layer and a lower layer on a side of said substrate, and a concentration of the impurity element serving as an acceptor doped into said upper layer is higher than a concentration of the impurity element serving as an acceptor doped into said lower layer.

3. The semiconductor device as claimed in claim 1, wherein a value of x in said first superlattice formation layer is greater than or equal to 0.5 and smaller than or equal to 1, and a value of y in said second superlattice formation layer is greater than 0 and smaller than 0.5.

4. The semiconductor device as claimed in claim 1, wherein the concentration of the impurity element doped into said first superlattice formation layer is greater than or equal to $5\times10^{18}/cm^3$ and smaller than or equal to $1\times10^{20}/cm^3$.

5. The semiconductor device as claimed in claim 1, wherein the concentration of the impurity element doped into said second superlattice formation layer is greater than or equal to $1\times10^{17}/cm^3$ and smaller than or equal to $1\times10^{18}/cm^3$.

6. The semiconductor device as claimed in claim 1, wherein a film thickness of said first superlattice formation layer is greater than or equal to 0.8 nm and smaller than or equal to 2.0 nm.

7. The semiconductor device as claimed in claim 6, therein the impurity element doped into said first superlattice formation layer is C, and the concentration of C is greater than or equal to $1\times10^{17}/cm^3$ and smaller than or equal to $1\times10^{20}/cm^3$.

8. The semiconductor device as claimed in claim 6, wherein the impurity element doped into said first superlattice formation layer is Fe, and the concentration of Fe is smaller than or equal to $1\times10^{19}/cm^3$.

9. A semiconductor device comprising:
   a superlattice buffer layer formed on a substrate;
   a first semiconductor layer formed by a nitride semiconductor on said superlattice buffer layer;
   a second semiconductor layer formed by a nitride semiconductor on said first semiconductor layer; and
   a gate electrode, a source electrode and a drain electrode formed on said second semiconductor layer,
   wherein said superlattice buffer layer is formed by periodically laminating a third superlattice formation layer, a second superlattice formation layer and a first superlattice formation layer in that order from said substrate,
   said first superlattice formation layer is formed by $Al_xGa_{1-x}N$, said second superlattice formation layer is formed by $Al_yGa_{1-y}N$, and said third superlattice formation layer is formed by $Al_zGa_{1-z}N$, where a relationship x>y>z is satisfied, and
   a concentration of an impurity element serving as an acceptor doped into said second superlattice formation layer is higher than a concentration of the impurity element serving as an acceptor doped into said first superlattice formation layer and said third superlattice formation layer.

10. The semiconductor device as claimed in claim 9, wherein a value of x in said first superlattice formation layer is greater than or equal to 0.5 and smaller than or equal to 1, and a value of y in said second superlattice formation layer is greater than 0 and smaller than 0.5.

11. The semiconductor device as claimed in claim 9, wherein the concentration of the impurity element doped into said first superlattice layer is greater than or equal to $5\times10^{18}/cm^3$ and smaller than or equal to $1\times10^{20}/cm^3$.

12. The semiconductor device as claimed in claim 9, wherein the concentration of the impurity element doped into said second superlattice formation layer is greater than or equal to $1\times10^{17}/cm^3$ and smaller than or equal to $1\times10^{18}/cm^3$.

13. The semiconductor device as claimed in claim 9, wherein a film thickness of said first superlattice formation layer is greater than or equal to 0.8 nm and smaller than or to 2.0 nm.

14. A semiconductor device comprising:
   a superlattice buffer layer formed on a substrate;
   a first semiconductor layer formed by a nitride semiconductor on said superlattice buffer layer;
   a second semiconductor layer formed by a nitride semiconductor on said first semiconductor layer; and
   a gate electrode a source electrode and a drain electrode formed on said second semiconductor layer,
   wherein said superlattice buffer layer is formed by periodically laminating a second superlattice formation layer, a first superlattice formation layer and a third superlattice formation layer in that order from said substrate,
   said first superlattice formation layer is formed by $Al_xGa_{1-x}N$ and said second superlattice formation layer is formed by $Al_yGa_{1-y}N$, where a relationship x>y is satisfied,
   said third superlattice formation layer is formed by a material containing InGaN, and
   a concentration of an impurity element serving as an acceptor doped into said second superlattice formation layer is higher than a concentration of the impurity element serving as an acceptor doped into said first superlattice formation layer and said third superlattice formation layer.

15. The semiconductor device as claimed in claim 14, wherein a value of x in said first superlattice formation layer is greater than or equal to 0.5 and smaller than or equal to 1, and a value of y in said second superlattice formation layer is greater than 0 and smaller than 0.5.

16. The semiconductor device as claimed in claim 14, wherein the concentration of the impurity element doped into said first superlattice formation layer is greater than or equal to $5\times10^{18}/cm^3$ and smaller than or equal to $1\times10^{20}/cm^3$.

17. The semiconductor device as claimed in claim 14, wherein the concentration of the impurity element doped into said second superlattice formation layer is greater than or equal to $1\times10^{17}/cm^3$ and smaller than or equal to $1\times10^{18}/cm^3$.

18. The semiconductor device as claimed in claim 14, wherein a film thickness of said first superlattice formation layer is greater than or equal to 0.8 nm and smaller than or equal to 2.0 nm.

* * * * *